(12) United States Patent
Birkett et al.

(10) Patent No.: US 10,852,076 B2
(45) Date of Patent: Dec. 1, 2020

(54) SEGMENTED CONFORMAL HEAT EXCHANGER

(71) Applicant: DANA CANADA CORPORATION, Oakville (CA)

(72) Inventors: Matthew S. Birkett, Toronto (CA); John G. Burgers, Oakville (CA)

(73) Assignee: Dana Canada Corporation, Oakville (CA)

(*) Notice: Subject to any disclaimer, the term of this patent is extended or adjusted under 35 U.S.C. 154(b) by 182 days.

(21) Appl. No.: 16/064,883

(22) PCT Filed: Dec. 16, 2016

(86) PCT No.: PCT/CA2016/051490
§ 371 (c)(1),
(2) Date: Jun. 21, 2018

(87) PCT Pub. No.: WO2017/106966
PCT Pub. Date: Jun. 29, 2017

(65) Prior Publication Data
US 2019/0003786 A1    Jan. 3, 2019

Related U.S. Application Data

(60) Provisional application No. 62/270,638, filed on Dec. 22, 2015.

(51) Int. Cl.
*F28F 9/26* (2006.01)
*F28F 3/12* (2006.01)
(Continued)

(52) U.S. Cl.
CPC .............. *F28F 9/26* (2013.01); *F28F 3/12* (2013.01); *H01L 35/30* (2013.01); *H01L 35/32* (2013.01);
(Continued)

(58) Field of Classification Search
CPC ...... F28F 9/26; F28F 2280/10; F28F 2230/00; F28F 3/12; F28F 2275/14; F28F 2265/26; H01L 35/32; H01L 35/30
See application file for complete search history.

(56) References Cited

U.S. PATENT DOCUMENTS 2,296,999 A    9/1942  Kottes
2,995,342 A *  8/1961  Quattrini ............... F28F 9/0241
                                                165/82

(Continued)

FOREIGN PATENT DOCUMENTS

CA       2617566      8/2008
CN     101828029      9/2010
(Continued)

OTHER PUBLICATIONS

European Patent Office, International Search Report with Written Opinion issued in PCT/CA2016/051490, dated Jun. 29, 2017, 11 pages, European Patent Office, Rijswijk, Netherlands.
(Continued)

*Primary Examiner* — Golam Mowla
(74) *Attorney, Agent, or Firm* — Ridout and Maybee LLP

(57) ABSTRACT

A heat exchanger capable of conforming to expansion/contraction due to external stresses as well as adjusting/adapting to surface imperfections at the interface of the heat exchanger with additional components is disclosed. The heat exchanger is made up of various heat exchanger elements where the elements are interconnected in such a manner that they can shift relative to one another along and/or about different axes while maintaining fluid flow through the heat exchanger. Each element has a fluid inlet, fluid outlet and a flow passage extending therebetween, the elements being arranged such that the outlet of one element is fluidly connected to the inlet of the adjacent element. The individual elements are also physically interconnected to allow
(Continued)

for longitudinal and/or lateral shifting in response to external expansion/contraction forces while maintaining fluid flow through the entire heat exchanger, as well as to tilting about each of these axes.

20 Claims, 22 Drawing Sheets

(51) Int. Cl.
 *H01L 35/32* (2006.01)
 *H01L 35/30* (2006.01)
(52) U.S. Cl.
 CPC ....... *F28F 2230/00* (2013.01); *F28F 2265/26* (2013.01); *F28F 2280/10* (2013.01)

(56) References Cited

U.S. PATENT DOCUMENTS

| | | | |
|---|---|---|---|
| 4,667,734 A * | 5/1987 | Langle | F28D 7/0058 165/145 |
| 5,289,870 A | 3/1994 | Dierbeck | |
| 6,193,284 B1 | 2/2001 | King | |
| 6,516,874 B2 * | 2/2003 | Mathur | F28D 9/0037 165/166 |
| 6,729,657 B2 * | 5/2004 | Haymon | F16L 5/10 285/136.1 |
| RE44,272 E | 6/2013 | Bell | |
| 8,540,012 B2 * | 9/2013 | Nagurny | B21D 53/02 165/165 |
| 8,656,710 B2 | 2/2014 | Bell | |
| 8,776,869 B2 | 7/2014 | Barnes | |
| 8,922,998 B2 | 12/2014 | Campbell | |
| 9,009,968 B2 | 4/2015 | Campbell | |
| 9,276,188 B2 | 3/2016 | Bell | |
| 10,458,725 B2 * | 10/2019 | Vanderwees | F28D 9/005 |
| 2003/0121649 A1 * | 7/2003 | Seiler | F28F 9/0246 165/167 |
| 2004/0182541 A1 * | 9/2004 | Blomgren | F28D 9/0043 165/78 |
| 2013/0075069 A1 | 3/2013 | Michael | |
| 2013/0327368 A1 | 12/2013 | Crane | |
| 2014/0048238 A1 | 2/2014 | Tan | |
| 2014/0174099 A1 | 6/2014 | Oh | |
| 2014/0216687 A1 | 8/2014 | Kaufman | |
| 2016/0054069 A1 | 2/2016 | Armsden | |
| 2016/0102925 A1 | 4/2016 | McWain | |
| 2016/0204486 A1 * | 7/2016 | Kenney | F28F 1/045 429/120 |
| 2016/0233403 A1 | 8/2016 | Bell | |

FOREIGN PATENT DOCUMENTS

| | | |
|---|---|---|
| CN | 202261093 | 5/2012 |
| CN | 104154777 | 11/2014 |
| CN | 104180451 | 12/2014 |
| CN | 104295448 | 1/2015 |
| WO | 2014132047 | 9/2014 |

OTHER PUBLICATIONS

China National Intellectual Property Administration, Office Action in application No. 201680075188.3, dated Jul. 2, 2019, 13 pages.

* cited by examiner

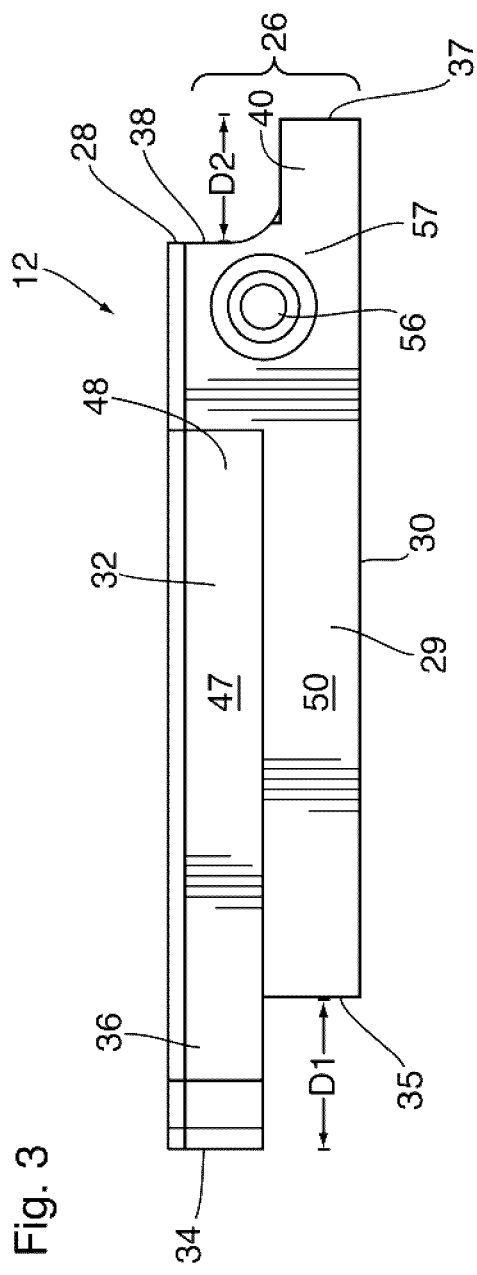
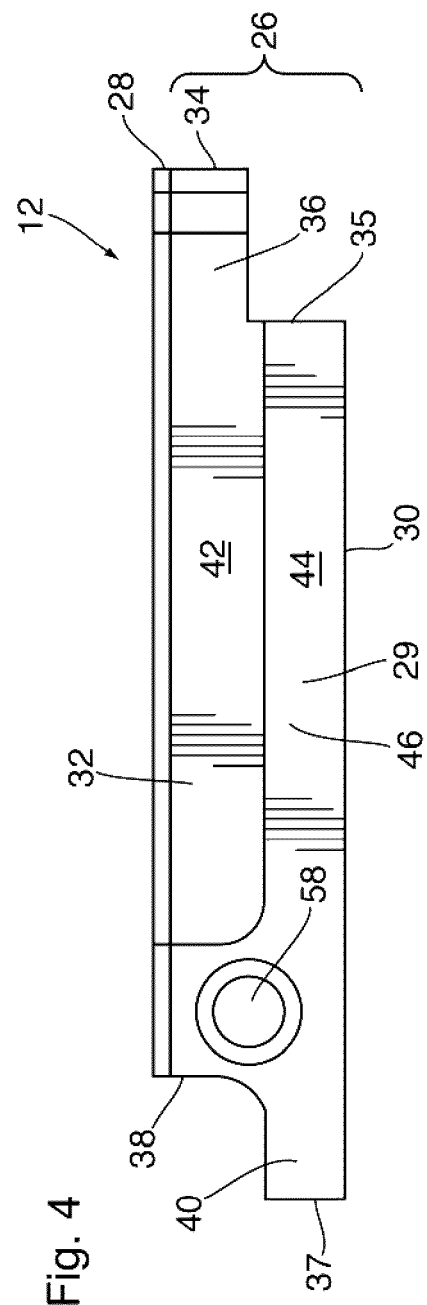

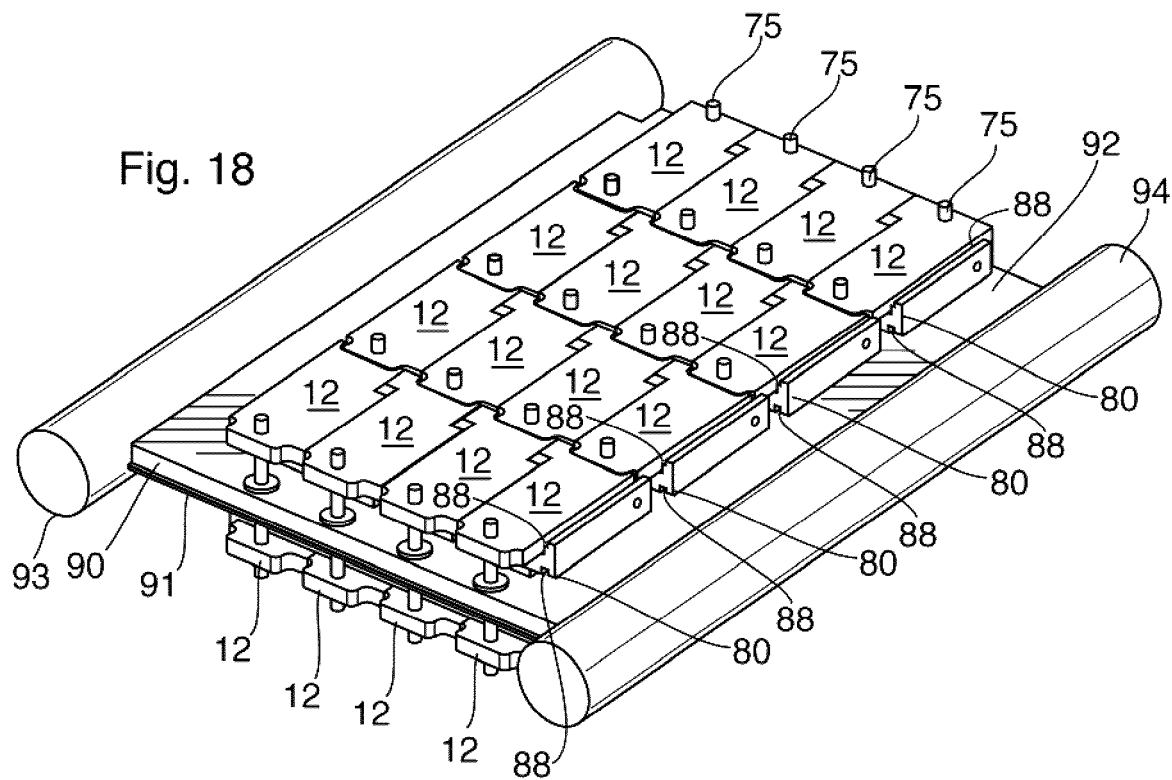
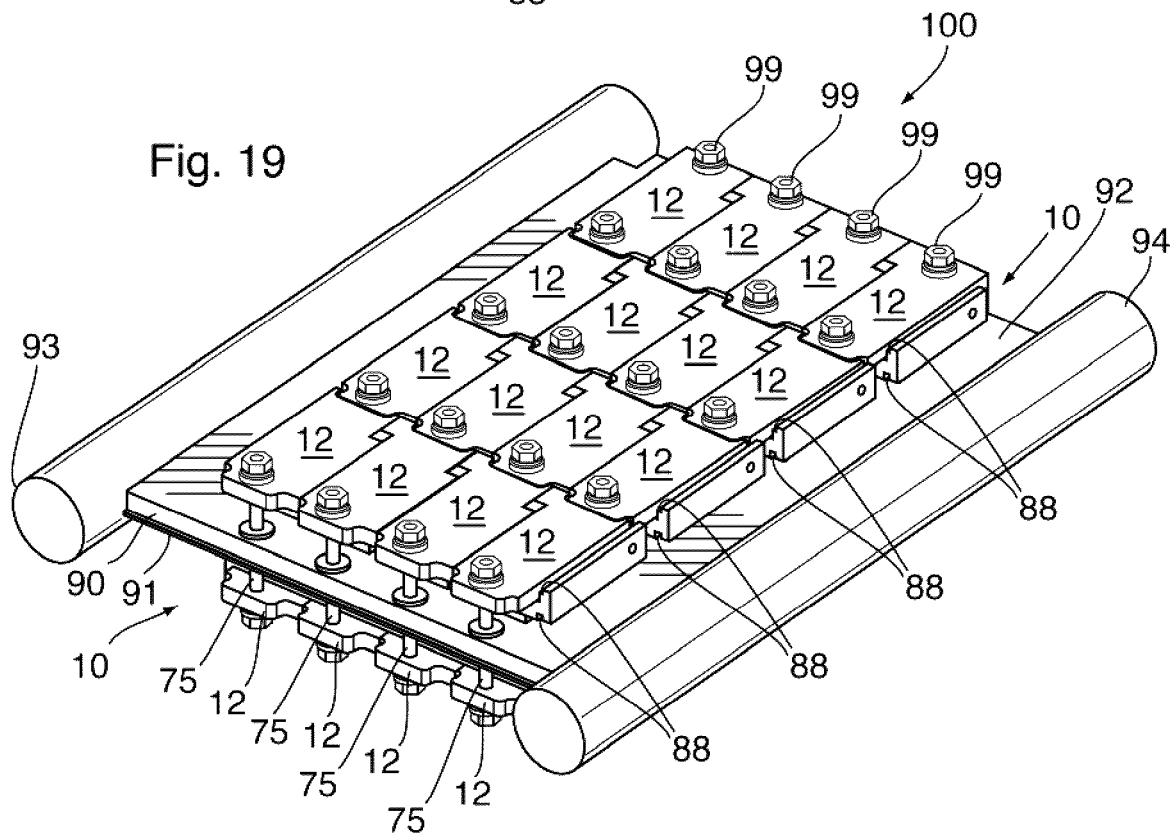

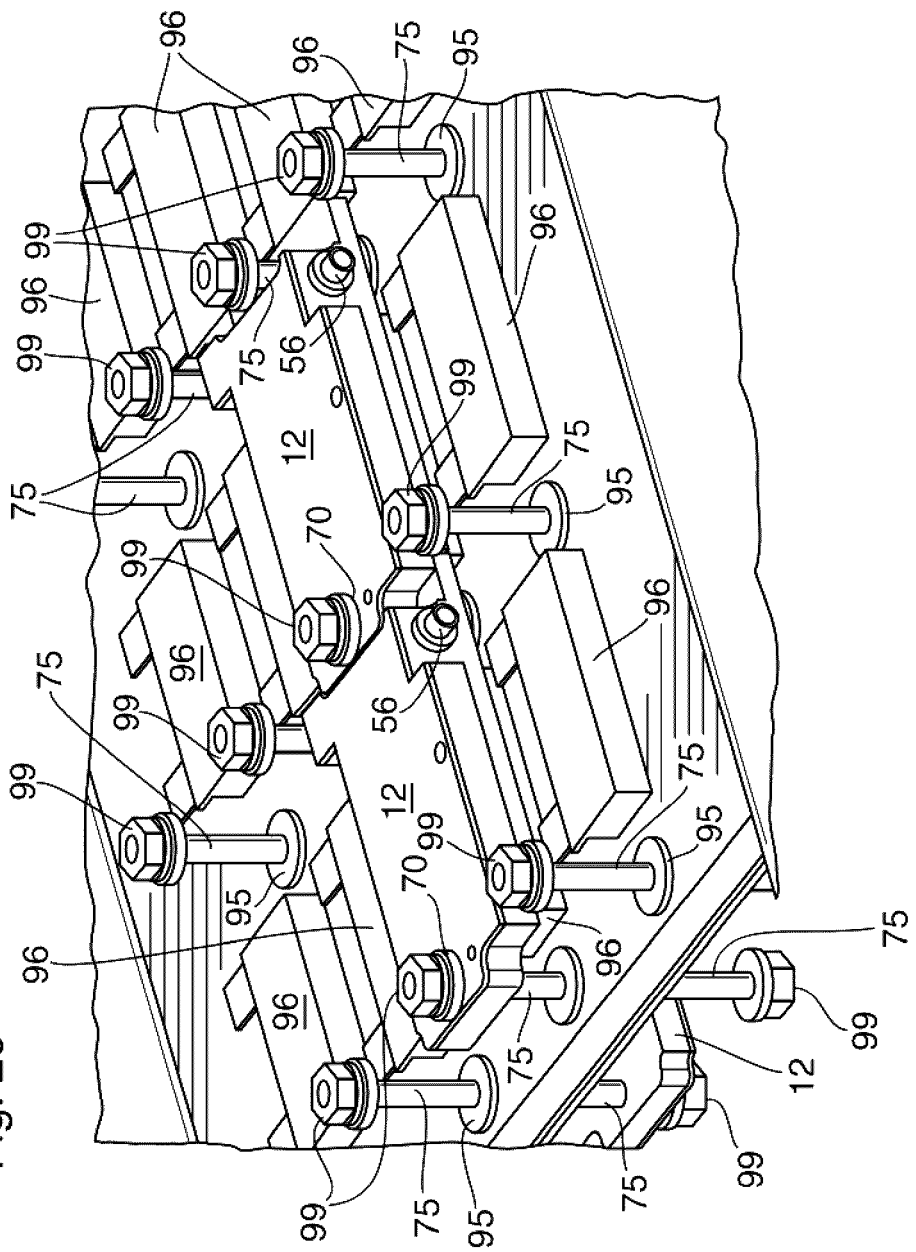

SEGMENTED CONFORMAL HEAT EXCHANGER

CROSS-REFERENCE TO RELATED APPLICATION

This application claims priority to and the benefit of United States Provisional Patent Application No. 62/270,638 filed Dec. 22, 2015, the contents of which are incorporated herein by reference.

TECHNICAL FIELD

The present disclosure relates to a segmented, conformal heat exchanger. In particular, the disclosure relates to a heat exchanger capable of conforming under external stresses by having segments that can shift along and/or about different axes while maintaining fluid flow through the heat exchanger as well as maintaining good thermal contact at the interface surfaces through the heat exchanger.

BACKGROUND

Heat exchangers, in general, are often subject to external stresses that are often related to the various temperatures to which they are exposed. For example, heat exchangers that are incorporated into thermoelectric generators (TEG's) are exposed to temperatures across a large range which imposes certain limitations on the construction of TEG's.

Thermoelectric generators are known and are used to convert heat into electrical energy. They can be incorporated into various types of systems in order to convert waste heat into additional electrical power/energy. More specifically, thermoelectric generators typically include at least a hot heat exchanger and at least a cold heat exchanger with one or more thermoelectric modules arranged therebetween. It is important to achieve good contact between the thermoelectric modules and the hot and cold heat exchangers, respectively, for proper functioning of the overall device. A suitable thermal interface material (TIM) is arranged at the interface of the thermoelectric modules and the hot heat exchanger as well at the interface with the cold heat exchanger, however, this material is typically subject to high stresses as a result of the wide range of temperatures to which the device is exposed which results in expansion/contraction of the hot heat exchanger on a much larger scale as compared to the cold heat exchanger. Given that the entire unit is generally tightly bundled or sandwiched together to ensure good thermal contact between the various components, the difference in the rate of expansion/contraction at the interface of the thermoelectric modules with the hot heat exchanger and with the cold heat exchanger exposes the thermal interface material to high stresses that often results in cracking or failure of the material at the interface which has an adverse effect on the functioning of the TEG. While thicker and/or more robust thermal interface material may be used in an effort to prevent cracking and/or failure, selecting thicker and/or more robust material often reduces the thermal contact between the heat exchangers and the thermoelectric modules which has an adverse effect on the overall performance of the TEG.

Therefore, providing heat exchangers that have the ability to maintain good thermal contact at their interface surfaces, whether it be for use within a thermoelectric generator or for other applications, and that can conform and/or adapt to expansion/contraction at their interface is useful especially in applications where the interface surfaces of a single heat exchanger is exposed to varying degrees of expansion/contraction and/or external stresses and where consistent thermal contact is required at the interface surface.

SUMMARY OF INVENTION

In accordance with an example embodiment of the present disclosure there is provided a heat exchanger, comprising: a plurality of heat exchanger elements, each said heat exchanger element having a principal axis and a transverse axis, and a fluid inlet, a fluid outlet and an internal flow path extending between and interconnecting said fluid inlet and fluid outlet; an inlet manifold element fluidly coupled to the fluid inlet of at least one of said plurality of heat exchanger elements; an outlet manifold element fluidly coupled to the fluid outlet of at least one of said plurality of heat exchanger elements; wherein said plurality of heat exchanger elements are interconnected, with each said heat exchanger element being connected to at least one adjacent said heat exchanger element to allow for expansion and/or contraction as well as rotational movement about said principal axis and/or said transverse axis.

In an embodiment, the plurality of heat exchanger elements includes a first heat exchanger element and a second heat exchanger element which are arranged transversely adjacent to one another, and wherein the internal flow paths of the first and second heat exchanger elements are fluidly coupled together.

In an embodiment, the plurality of heat exchanger elements includes a first heat exchanger element and a second heat exchanger element which are arranged transversely adjacent to one another, and wherein the first and second heat exchanger elements include lateral edge portions which interlock with one another so as to connect the first and second heat exchanger elements together.

In an embodiment, the plurality of heat exchanger elements includes a first heat exchanger element and a third heat exchanger element which are arranged longitudinally adjacent to one another, and wherein the first and third heat exchanger elements include longitudinal edge portions which interlock with one another so as to connect the first and third heat exchanger elements together.

In an embodiment, one of said fluid inlet and fluid outlet of each of said first heat exchanger element and said second heat exchanger element is in the form a protrusion extending away from the lateral edge portion of said first or second heat exchanger element, the other of said fluid inlet and fluid outlet being in the form of an opening adapted to slidingly receive the protrusion from the transversely adjacent first or second heat exchanger element so as to fluidly couple the internal flow path of the first heat exchanger element to the internal flow path of the second heat exchanger element.

In an embodiment, a sliding face seal is provided between the inlet manifold element and each said heat exchanger element having its fluid inlet coupled to the inlet manifold element, and a sliding face seal is provided between the outlet manifold element and each said heat exchanger element having its fluid outlet coupled to the inlet manifold element; said heat exchanger further comprising a sealing device arranged at each of the sliding face seals, said sealing devices providing a sliding interface over which said heat exchanger elements can slide when engaged with said inlet and outlet manifold elements.

In an embodiment, each said sliding face seal is formed between a fluid opening in one of the manifold elements and a fluid inlet or fluid outlet of one of said heat exchanger elements, and wherein the fluid inlet or outlet is provided along an exposed lateral edge of the heat exchanger element; and wherein the sealing element of each said sliding face seal comprises an O-ring which is received in an annular groove surrounding one of the fluid openings of one of the manifold elements or the fluid inlet or outlet of one of said heat exchanger elements.

In an embodiment, each said annular groove surrounds one of the fluid openings of one of the manifold elements, and wherein the fluid openings of the manifold elements have a larger diameter than the fluid inlets and outlets of the heat exchanger elements.

In an embodiment, each said manifold element has an inner surface along one or more of said fluid openings are provided; wherein a receiving groove is provided along the inner surface; wherein the exposed lateral edge of the heat exchanger element is formed on a mating outer edge portion of the heat exchanger element; and wherein said mating outer edge portion is adapted to be slidingly received in a tongue-and-groove arrangement in said receiving groove.

In an embodiment, at least one of said heat exchanger elements comprises: a bottom portion and a top portion enclosing a fluid cavity, said bottom portion having a generally planar bottom surface; said heat exchanger element having a first interlocking longitudinal end portion, a second interlocking longitudinal end portion generally opposed to said first interlocking longitudinal end portion, a first lateral interlocking edge portion and a second lateral interlocking edge portion generally opposed to said first lateral interlocking edge portion; wherein said fluid inlet extends through a first lateral side surface of the heat exchanger element to be in fluid communication with said fluid cavity, said fluid outlet extends through an opposed second lateral side surface of the heat exchanger element at a location generally opposed to and aligned longitudinally with said fluid inlet so as to be in fluid communication with said fluid cavity, said internal flow path being formed within said fluid cavity.

In an embodiment, said first longitudinal interlocking end portion of one said heat exchanger element is connected to the second longitudinal interlocking end portion of a longitudinally adjacent said heat exchanger element, and wherein the first lateral interlocking edge portion of one said heat exchanger element is connected to the second lateral interlocking edge portion of a transversely adjacent said heat exchanger element, the interlocking lateral edge portions of said adjacent heat exchanger elements establishing fluid communication between the internal flow paths of the heat exchanger elements.

In an embodiment, said first and second interlocking longitudinal end portions of the longitudinally adjacent heat exchanger elements each comprise a through-hole extending therethrough, the through-hole in one of the first and second interlocking longitudinal end portions being larger than the through-hole formed in the other of the first and second interlocking longitudinal end portions, said through-holes formed in said first and second interlocking longitudinal end portions overlapping when said longitudinally adjacent heat exchanger elements are arranged in interlocking relationship; and wherein a locating rod is inserted through said overlapping through-holes.

In an embodiment, said locating rod is securely fixed in one of said overlapping through-holes for securing the corresponding heat exchanger element to said locating rod; and wherein said locating rod has a diameter which is smaller than the other of said overlapping through-holes, the corresponding heat exchanger element being movable with respect to the longitudinally adjacent heat exchanger element about said locating rod.

In an embodiment, the interlocking longitudinal end portions of the longitudinally adjacent heat exchanger elements and said interlocking lateral edge portions of the laterally adjacent heat exchanger elements each comprise mating generally parallel sliding surfaces.

In an embodiment, the heat exchanger further comprises a fin plate insert arranged within said fluid cavity for defining said internal flow path between said fluid inlet and said fluid outlet.

In an embodiment, the heat exchanger further comprises a pair of threaded holes formed on either side of the through-hole formed in said first longitudinal end for receiving set screws for limiting relative tilting movement between one heat exchanger element and a longitudinally adjacent heat exchanger element about the principal axis.

In accordance with another example embodiment of the present disclosure there is provided a thermoelectric generator assembly comprising: a hot heat exchanger having a pair of spaced apart walls defining a fluid flow path therebetween for the flow of a first heat exchange fluid therethrough; a plurality of thermoelectric modules arranged on the outer surface of each of said spaced apart walls; a pair of cold heat exchangers arranged on either side of said hot heat exchanger in contact with said plurality of thermoelectric modules for the flow of a second heat exchange fluid therethrough, wherein each of said cold heat exchangers comprises: a plurality of heat exchanger elements, each said heat exchanger element having a principal axis and a transverse axis, and a fluid inlet, a fluid outlet and an internal flow path extending between and interconnecting said fluid inlet and fluid outlet; an inlet manifold fluidly coupled to the fluid inlet of at least one of said plurality of heat exchanger elements; an outlet manifold fluidly coupled to the fluid outlet of at least one of said plurality of heat exchanger elements; wherein said plurality of heat exchanger elements are interconnected, with each said heat exchanger element being connected to at least one adjacent said heat exchanger element to allow for expansion and/or contraction of said plurality of heat exchanger elements along said principal axis as well as rotational movement about said principal axis and/or said transverse axis; a plurality of rods extending through said cold heat exchangers and through said hot heat exchanger for securing said cold heat exchangers to said hot heat exchanger and for establishing thermal contact between said cold heat exchangers and said thermoelectric modules.

In an embodiment, each said heat exchanger element has a first end portion and a second end portion generally opposed to said first end portion; wherein each said rod is securely fixed to said hot heat exchanger and extends through one of the end portions of one of said heat exchanger elements forming one of said cold heat exchangers; wherein the first end portion of each said heat exchanger element is securely fixed to a first one of rods extending through said first end, and the second end portion of each said heat exchanger element is movable about a second one of said rods extending through said second end.

In an embodiment, said hot heat exchanger generally operates at a temperature of about 700° C. and said cold heat exchangers generally operate at a temperature of about 110° C.

In an embodiment, the number of heat exchanger elements in each cold heat exchanger corresponds to the number of thermoelectric modules arranged on the corresponding side of the hot heat exchanger.

BRIEF DESCRIPTION OF THE DRAWINGS

Reference will now be made, by way of example, to the accompanying drawings which show example embodiments of the present application, and in which:

FIG. 3 is a front elevation view of the heat exchanger element of FIG. 2;

FIG. 4 is a rear elevation view of the heat exchanger element of FIG. 2;

FIG. 18 is a perspective view of a partially assembled thermoelectric generator of FIG. 16;

FIG. 19 is a perspective view of the fully assembled thermoelectric generator of FIG. 18;

FIG. 20 is a detail view of a portion of a partially assembled thermoelectric generator as shown in FIGS. 17 and 18;

Similar reference numerals may have been used in different figures to denote similar components.

DESCRIPTION OF EXAMPLE EMBODIMENTS

Figure 1:
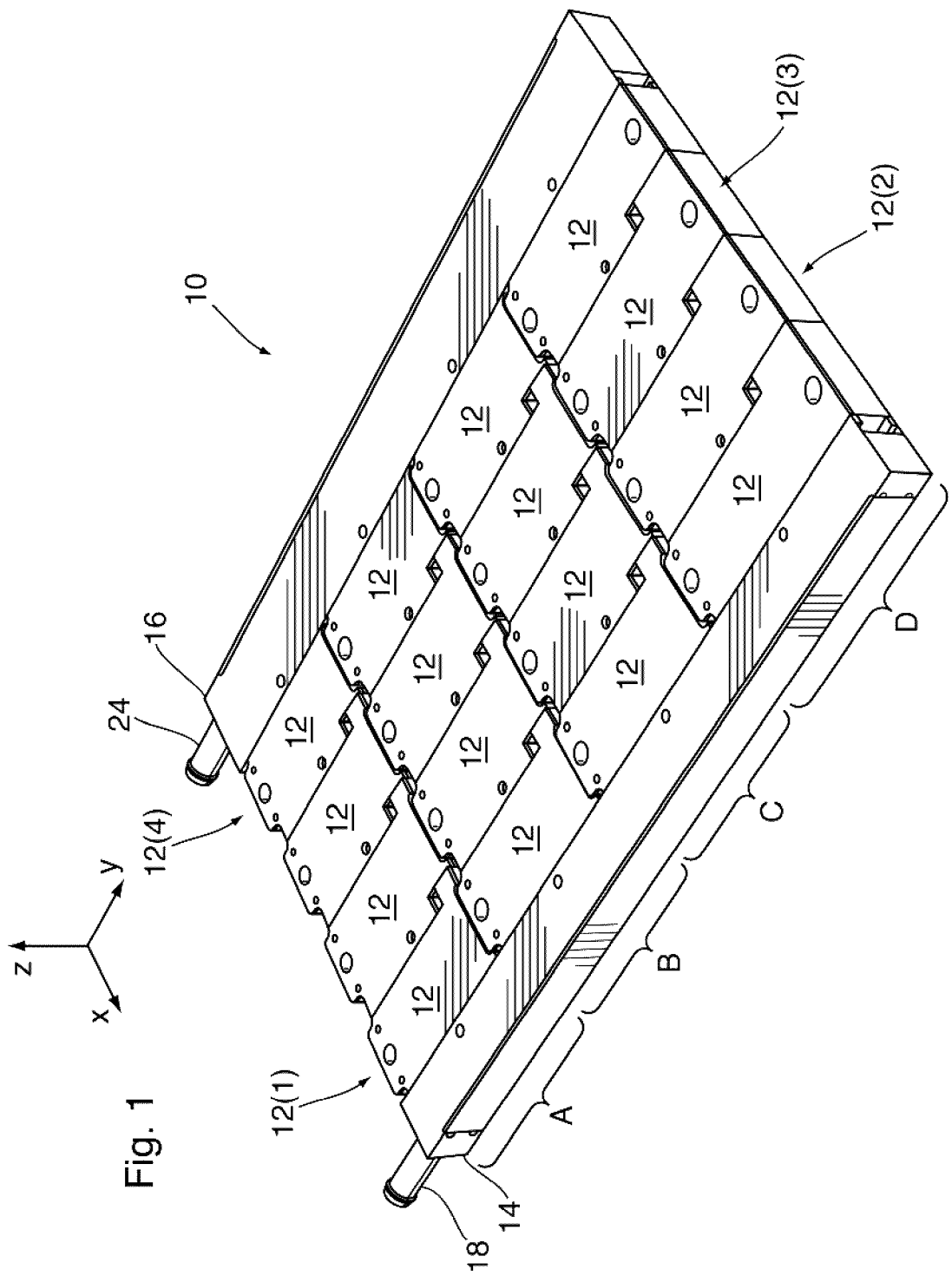
FIG. 1 is a top, perspective view of a heat exchanger according to an example embodiment of the present disclosure.

Referring to the drawings there is shown in FIG. 1 an example embodiment of a heat exchanger 10 according to the present disclosure. In the subject example embodiment, the heat exchanger 10 is sub-divided or segmented in such a manner that the heat exchanger 10 is made up of a plurality of individual heat exchanger elements 12 that are arranged together and interconnected to form a heat exchanger core of heat exchanger 10. While FIG. 1 shows the heat exchanger 10 being made up of sixteen individual heat exchanger elements 12, the actual number and/or overall size of the individual heat exchanger elements 12 can vary depending on the particular application and/or particular design requirements. Accordingly, it will be understood that the present disclosure is not intended to be limited to a heat exchanger 10 formed from sixteen individual heat exchanger elements 12 and that other variations are contemplated within the scope of the present disclosure.

For ease of reference FIG. 1 shows an x-y-z coordinate system, wherein the y axis is also referred to herein as the longitudinal or principal axis of the heat exchanger 10 and the individual heat exchanger elements 12. The x axis is referred to herein as the transverse or lateral axis.

The heat exchanger elements 12 are arranged in a plurality of laterally extending rows (labeled A, B, C, D in FIG. 1), and in the present embodiment each laterally extending row A, B, C, D is made up of four heat exchanger elements 12, labeled as 12(1), 12(2), 12(3) and 12(4) for the purpose of the following discussion. The two heat exchanger elements 12(1), 12(4) at the opposite ends of each row are sometimes referred to below as "outer" heat exchanger elements, and the two heat exchanger elements 12(2), 12(3) between the outer heat exchanger elements 12(1), 12(4) are sometimes referred to below as "inner" heat exchanger elements. Also, each of the heat exchanger elements 12 in row D has a slightly different configuration than the corresponding heat exchangers in the other rows, as will be further described below. All heat exchanger elements 12 have very similar structures, and unless otherwise indicated, the following discussion applies to all heat exchanger elements 12, regardless of their location in heat exchanger 10.

Figure 1A:
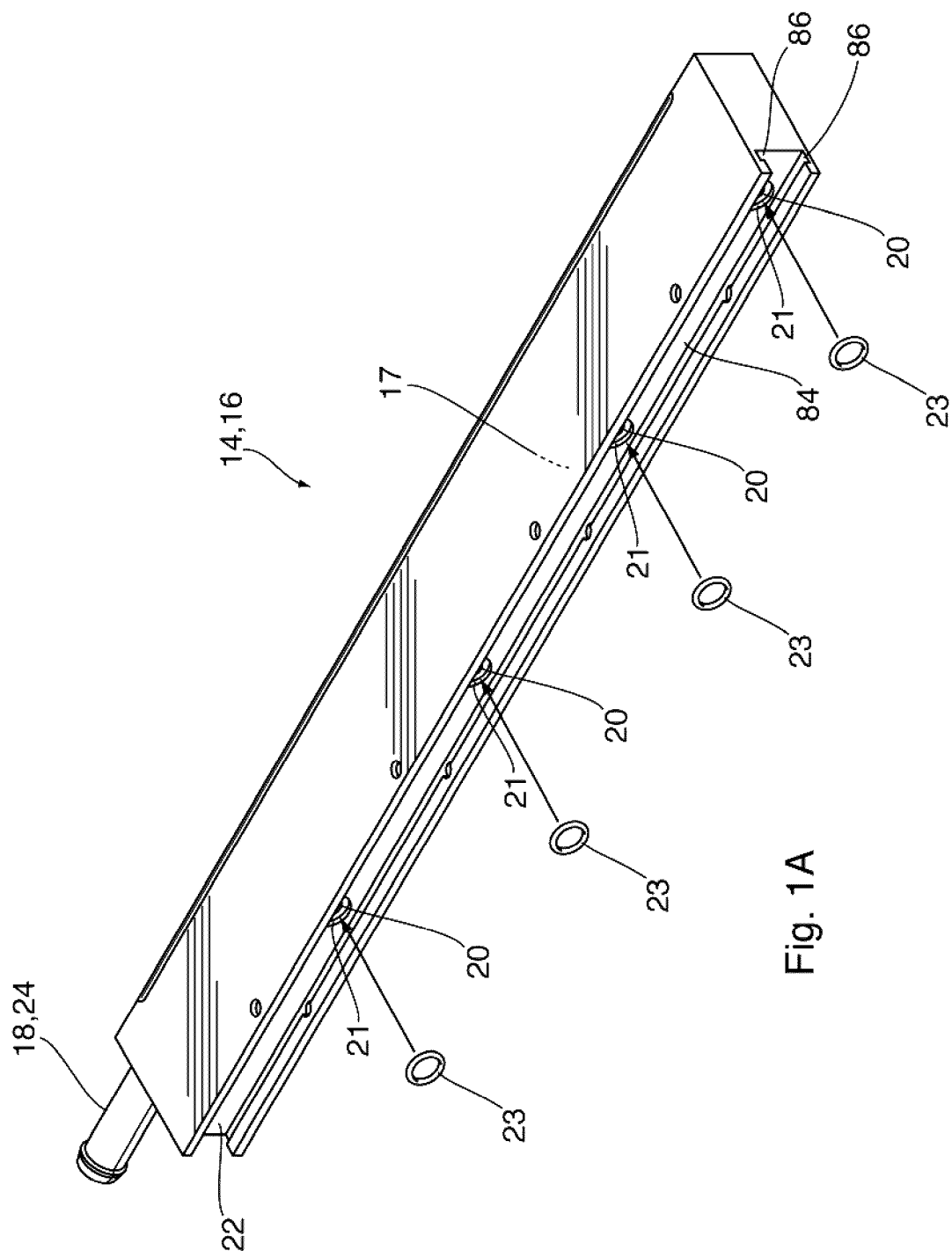
FIG. 1A is a top, perspective view of a manifold element of the heat exchanger of FIG. 1.
Figure 1B:
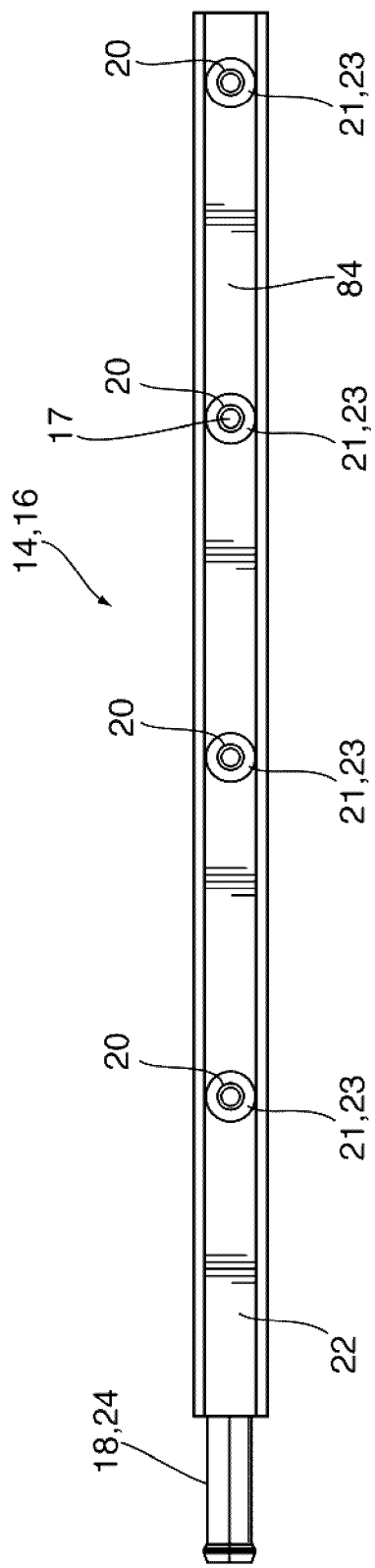
FIG. 1B is a front elevation view of the manifold element of FIG. 1A.
Figure 2:
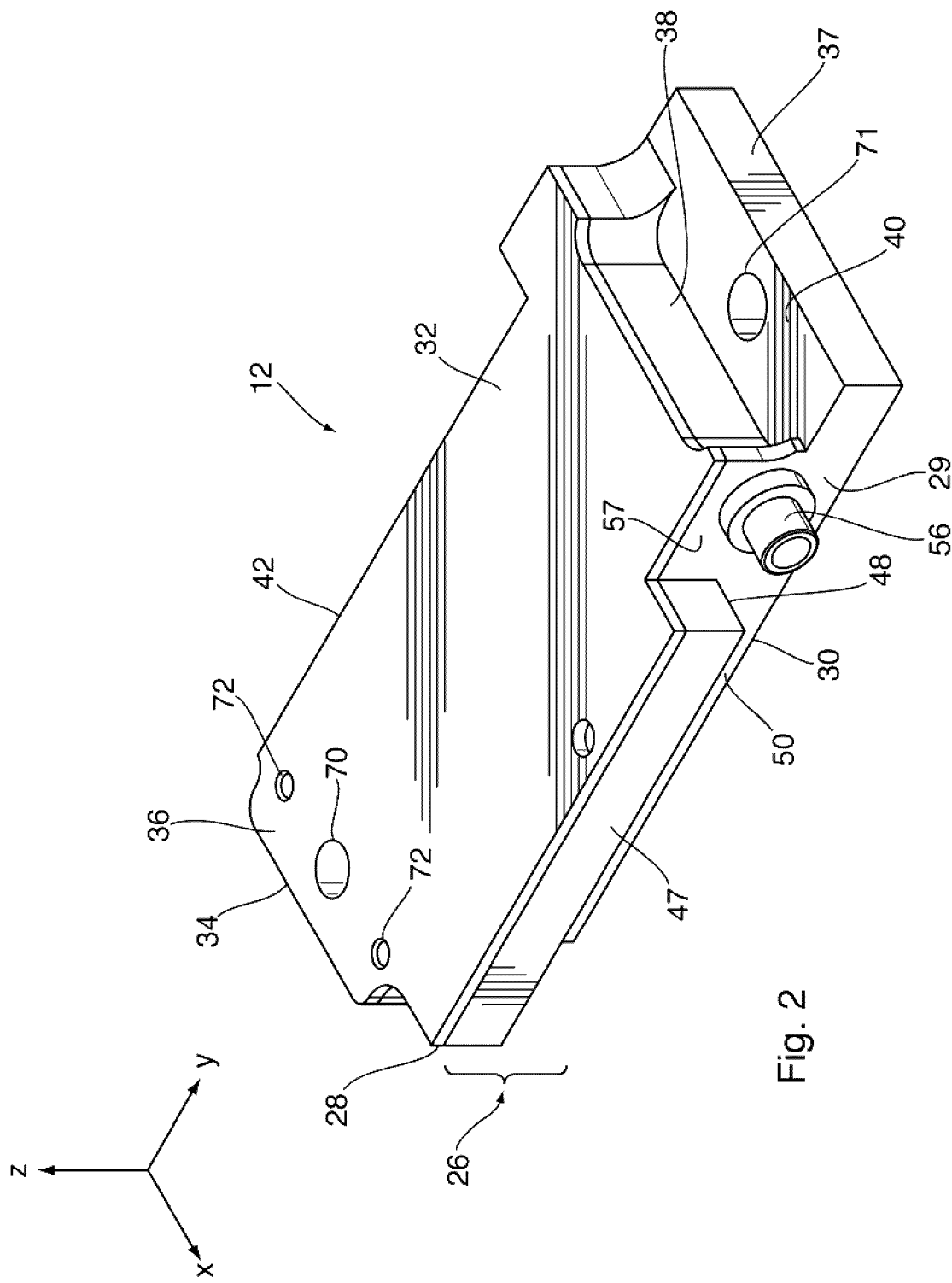
FIG. 2 is a top, perspective view of an individual heat exchanger element that forms part of the heat exchanger of FIG. 1.

An inlet manifold element 14 and an outlet manifold element 16 are arranged on opposite lateral sides of the plurality of individual heat exchanger elements 12 for delivering and discharging a heat exchange fluid to/from the heat exchanger 10, and extend longitudinally throughout the length of heat exchanger 10. Fluid enters the heat exchanger 10 through one of the fluid fittings inlet fitting 18, from where it is distributed longitudinally along the inlet manifold element 14 through an interior channel 17 formed therein from where it is transmitted to each laterally extending row of heat exchanger elements 12 via fluid openings 20 formed at longitudinally spaced apart intervals along the inner surface 22 of the inlet manifold element 14, the fluid openings 20 also being referred to herein as "manifold ports 20". See, for instance, FIGS. 1A and 1B.

Each of the fluid openings 20 of inlet manifold element 14 is fluidly connected to the first heat exchanger element 12(1) of each laterally extending row of heat exchanger elements 12 and is surrounded by a corresponding annular groove 21 for receiving suitable sealing device 23 for providing an appropriate face-seal against the corresponding fluid opening formed in the corresponding heat exchanger element 12(1). In the subject example embodiment, the inlet manifold element 14 is also formed with a receiving groove 84 along its inner surface 22 for receiving the corresponding, mating outer edge portion 80 of each first heat exchanger element 12(1) in a tongue-and-groove arrangement, so that each of the first heat exchanger elements 12(1) can slide longitudinally along the groove 84 into position when the heat exchanger 10 is assembled. Each sealing device 23 comprises an O-ring arranged in one of the grooves 21 around each of the fluid openings 20, and is selected such that it provides a sliding face seal that permits the mating outer edge portions 80 of the first heat exchanger elements 12(1), each having a fluid opening 82, to slide longitudinally along the inlet manifold element 14 while maintaining alignment with one of the manifold ports 20, to ensure an appropriate seal is maintained at the interface between the manifold ports 20 and the first heat exchanger elements 12(1) that prevents egress of fluid from the manifold ports 20.

Outlet manifold element 16 is similar in structure to the above described inlet manifold element 14 with outlet manifold element 16 having an interior channel 17 for receiving the heat exchanger fluid that is discharged from the last heat exchanger element 12 in each of the laterally extending rows, in this instance heat exchanger element 12(4), through the corresponding fluid openings 20 formed at spaced apart intervals along the inner surface 22 of the outlet manifold element 16 with corresponding grooves 21 formed around each of the fluid openings 20, the last heat exchanger element 12(4) in each laterally extending row of heat exchanger elements 12 having a mating outer edge portion 80 to be slidingly received in a tongue-and-groove arrangement in a receiving groove 84 provided along inner surface 22 of outlet manifold element 16. Each of the last heat exchanger elements 12(4) is fluidly connected to outlet manifold element 16 through a generally fluid tight interconnection with each of the fluid openings 20, the fluid tight interconnection being achieved due to the sliding face of the sealing device 23 arranged within grooves 21 which permit the last heat exchanger elements 12(4) to slide longitudinally into position along the inner surface 22 of outlet manifold element 16, while ensuring an appropriate seal at the interface therebetween. Accordingly, fluid is discharged from the last heat exchanger element 12(4) of each laterally extending row of heat exchanger elements 12 into manifold element 16 where it exits the heat exchanger 10 through corresponding outlet fitting 24.

Figure 21:
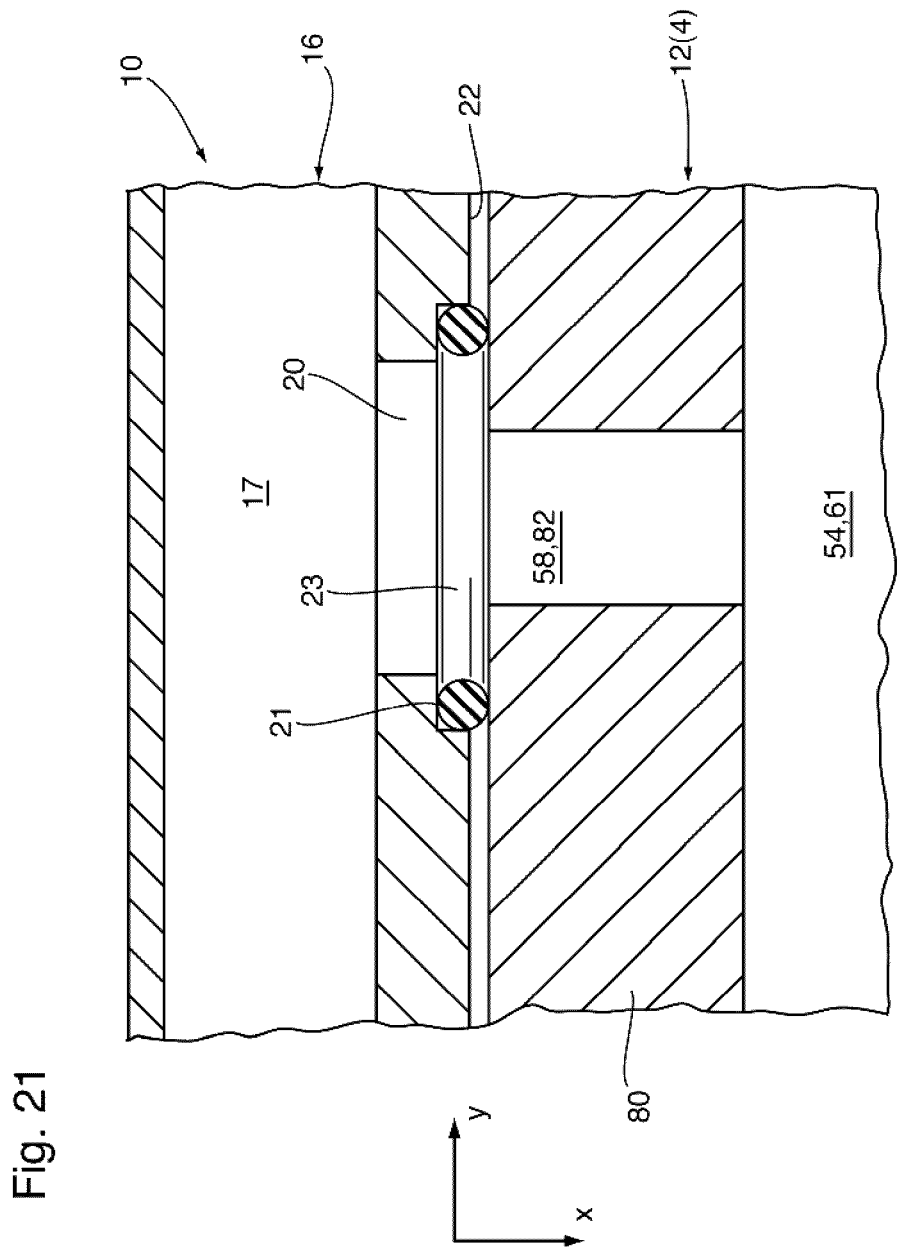
FIG. 21 is a cross-section in an x-y plane through one of the sliding face seals between an outer heat exchanger element and the outlet manifold element.

FIG. 21 is a close-up cross-section showing one of the sliding face seals between an outer heat exchanger element 12(4) and the outlet manifold element 16. The sliding face seal is formed between fluid opening 20 in the manifold elements and a fluid outlet 58 of one of said heat exchanger elements 12(4). In the outer heat exchanger element, the fluid outlet 58 comprises a fluid opening 82 which is provided along an exposed lateral edge 80 of the heat exchanger element 12(4). The sliding face seal includes a sealing element 23 in the form of an O-ring which is received in an annular groove 21 surrounding the fluid opening 21 of the outlet manifold element 16, and is compressed between the outlet manifold 16 and the exposed lateral edge 80 of the heat exchanger element 12.

Although FIG. 21 shows the sealing element 23 provided in a groove 21 of the outlet manifold element 16, it will be appreciated that the groove 21 and sealing element 23 may instead be provided around the fluid opening 82 of the heat exchanger element 12.

It can be seen from FIG. 21 that the fluid opening 82 of the heat exchanger element 12 has a smaller diameter than the fluid opening 20 of the outlet manifold element 16. This permits some relative longitudinal displacement between outlet manifold element 16 and heat exchanger element 12 caused by thermal expansion without compromising the fluid-tight seal between the heat exchanger element 12 and the outlet manifold element 16. The same discussion applies to the sliding face seals between the inlet manifold element 14 and the outer heat exchanger elements 12(1) fluidly connected thereto.

Thus, it can be seen that some of the heat exchanger elements 12(1) are slidingly connected to the inlet manifold element 14 and some of the heat exchanger elements 12(4) are slidingly connected to the outlet manifold element 16, and that the heat exchanger 10 comprises a sealing device 23 arranged at each of the fluid connections between the heat exchanger elements 12(1), 12(4) and either the inlet manifold element 14 or the outlet manifold element 16. The sealing devices 23 provide a sliding interface over which the heat exchanger elements 12(1), 12(4) can slide when engaged with the inlet and outlet manifold elements 14, 16. The interconnection between the individual heat exchanger elements 12(1) and 12(4) with the inlet and outlet manifold elements 14, 16 is described in further detail below.

Referring now to FIGS. 2-8 there is shown one of the heat exchanger elements 12 that forms heat exchanger 10, and more specifically one of the inner heat exchanger elements 12(2), 12(3) or row A, B or C. Unless otherwise indicated, the following discussion also applies to the outer heat exchanger elements 12(1), 12(4) and/or the heat exchanger elements 12 of row D.

Each heat exchanger element 12 is made up of a bottom portion 26 and a top portion 28 which enclose a fluid cavity 54. In the subject example embodiment, the bottom portion 26 is a solid, generally rectangular body that is machined or otherwise formed with a flat bottom 30 and walls defining the fluid cavity 54. The bottom portion 26 is also formed with the required interlocking features, while the top portion 28 is in the form of a cover plate which covers the open top of the fluid cavity 54. However, it will be appreciated that the bottom and top portions 26, 28 do not necessarily have the exact configuration shown in the drawings.

For ease of reference, features of the heat exchanger element 12 shown in FIGS. 2 to 8 will now be described in relation to the x-y-z coordinate system. More specifically, the heat exchanger element 12 has a lower portion 29 with first and second longitudinally spaced ends 35, 37 and an upper portion 32 with first and second longitudinally spaced ends 34, 38. The lower and upper portions 29, 32 are offset relative to one another along the y-axis (i.e. the longitudinal or principal axis) so as to provide the heat exchanger element 12 with a first interlocking longitudinal end portion 36 that overhangs the first end 35 of the lower portion 29 by a first distance D1 along the y-axis. Similarly, the offsetting of the lower and upper portions 29,32 provides the heat exchanger element 12 with a second interlocking longitudinal end portion 40 produced by the second end 38 of the upper portion 32 being inset from the second end 37 of the lower portion 29 by a distance D2 along the y-axis, as shown in FIGS. 3 and 4. In the present embodiment, the lower and upper portions 29, 32 are both provided in the bottom portion 26 of heat exchanger element 12. However, it will be appreciated that this is not essential. For example, the lower and upper portions 29 could instead be defined in the respective bottom and top portions 26, 28 of the heat exchanger element 12.

Figure 5:
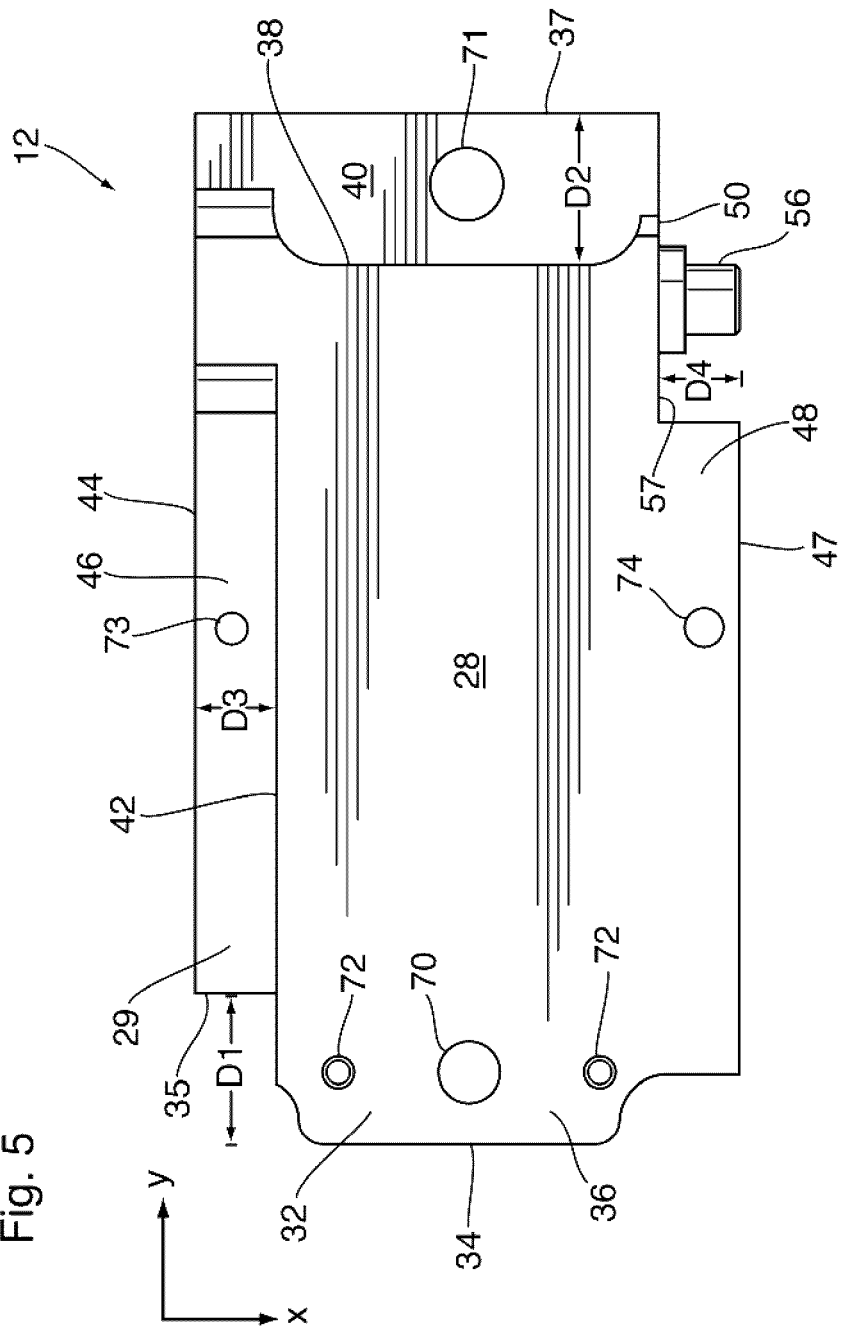
FIG. 5 is a top plan view of the heat exchanger element of FIG. 2.
Figure 6:
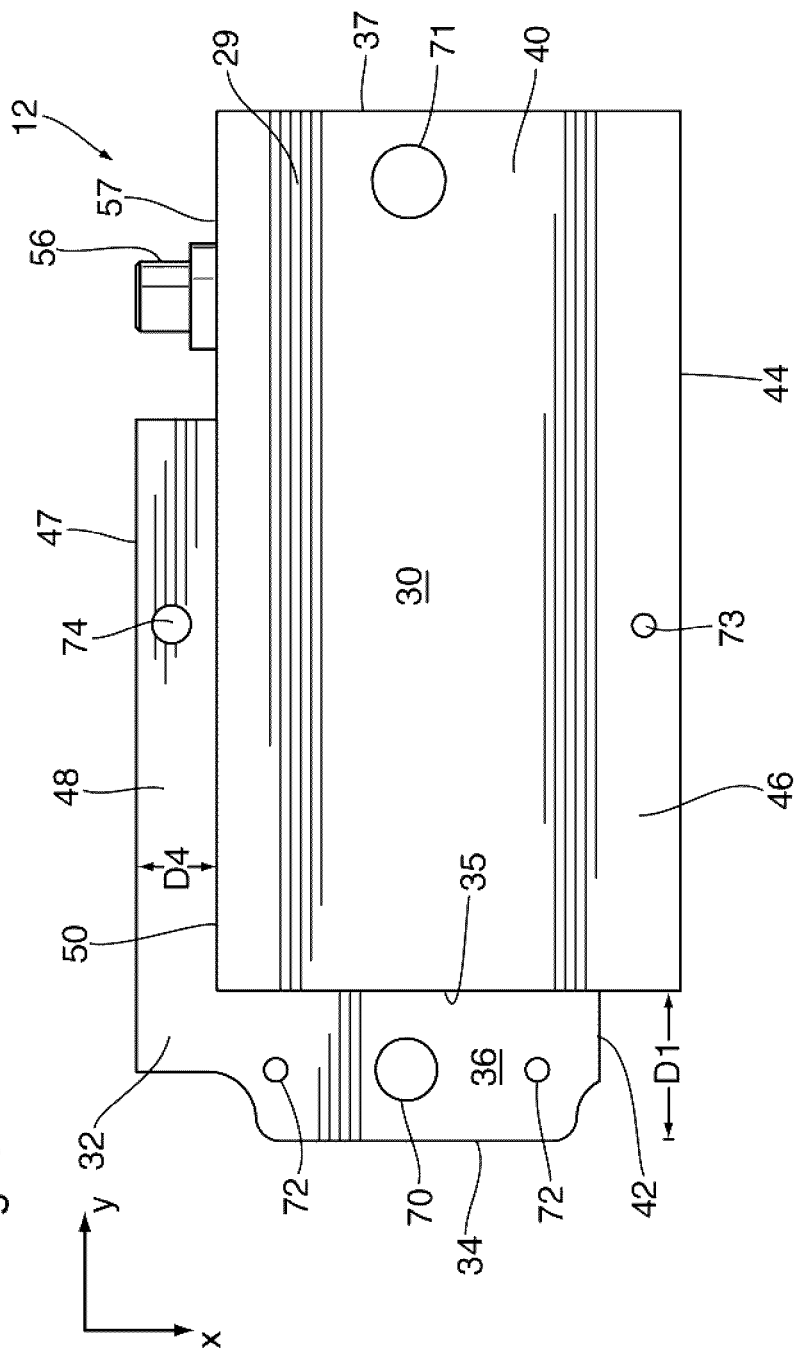
FIG. 6 is a bottom plan view of the heat exchanger element of FIG. 2.

The lower and upper portions 29, 32 are also laterally offset relative to one another along the x-axis (i.e. the transverse or lateral axis). In this regard, the upper portion 32 has first and second lateral edges 42, 47 and the lower portion 29 has first and second lateral edges 44, 50. The first lateral edge 42 of the upper portion 32 is inset from the first lateral edge 44 of lower portion 29 by a distance D3 along the x-axis to provide heat exchanger element 12 with a first lateral interlocking edge portion 46. Similarly, the second lateral edge 47 of the upper portion 32 overhangs or projects outwardly from the second lateral edge 50 of the lower portion 29 by a distance D4 along the x-axis to provide heat exchanger element 12 with a second lateral interlocking edge portion 48 as shown in FIGS. 5 and 6.

Figure 7:
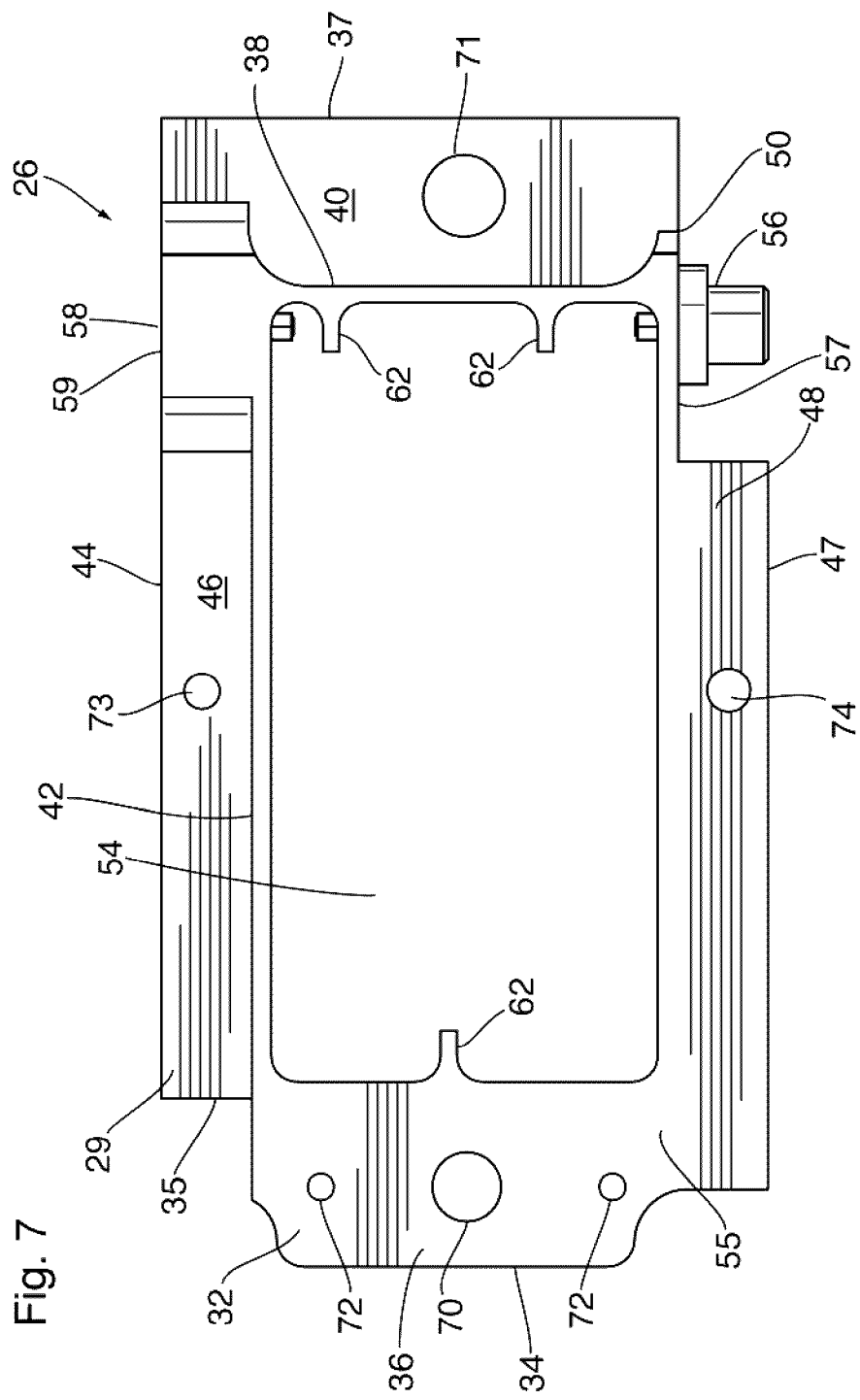
FIG. 7 is a top, plan view of the heat exchanger element of FIG. 2 with the cover portion removed.
Figure 8:
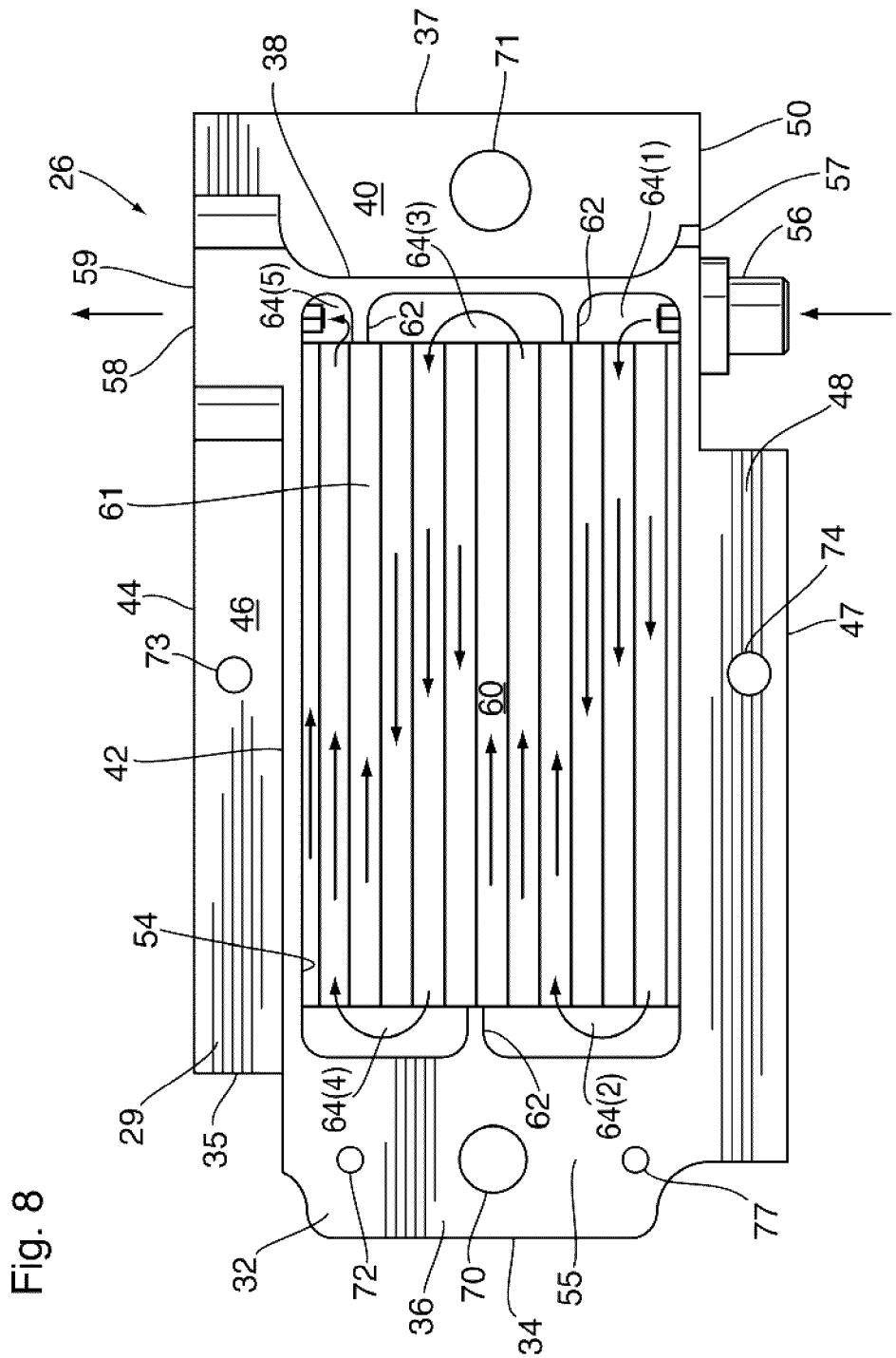
FIG. 8 is a top, plan view of the heat exchanger element of FIG. 7 with a fin plate arranged therein.
Figure 9:
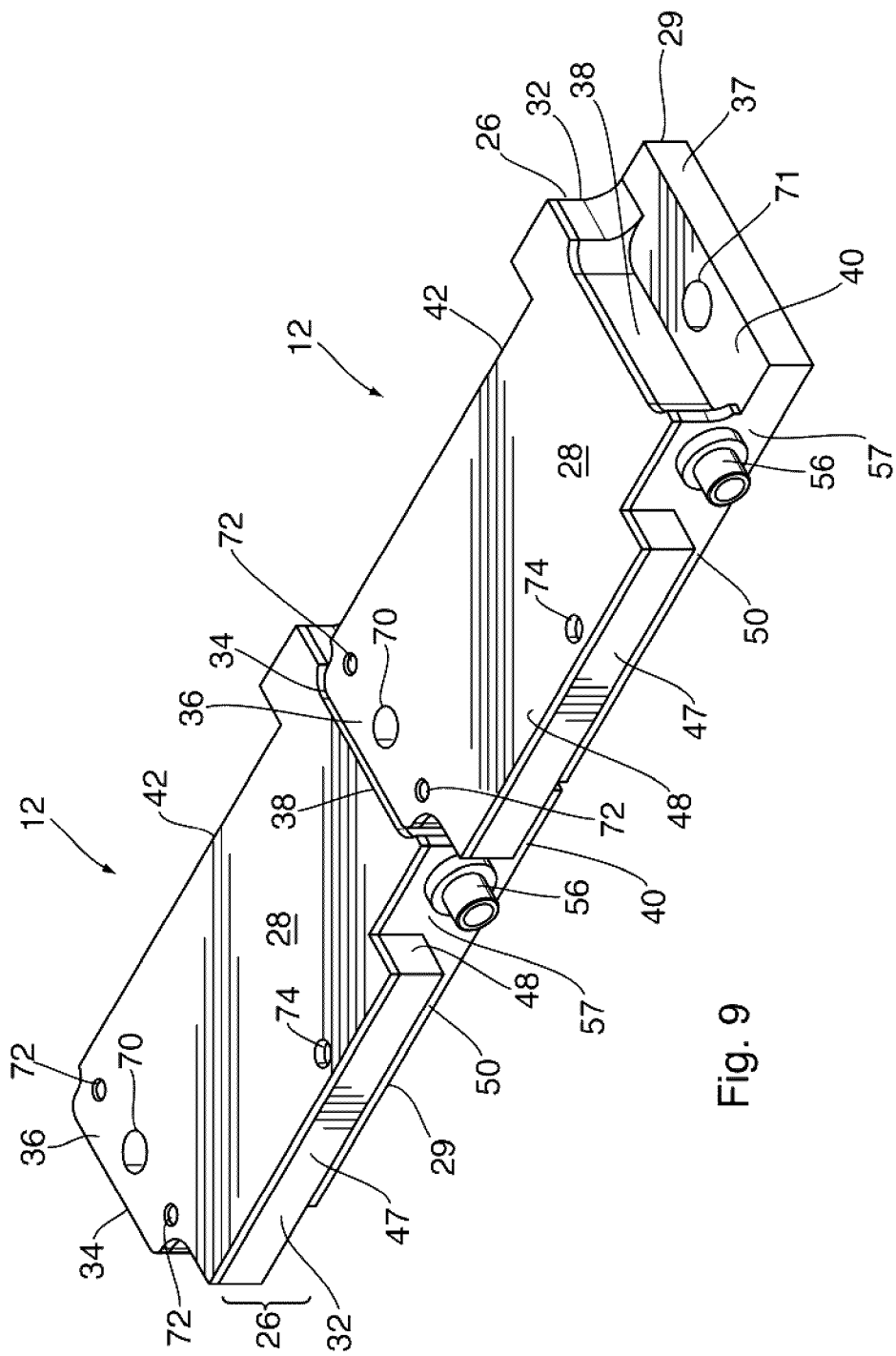
FIG. 9 is a top, perspective view illustrating two of the heat exchanger elements that form part of the heat exchanger of FIG. 1 arranged in their mating, interlocking relationship.
Figure 10:
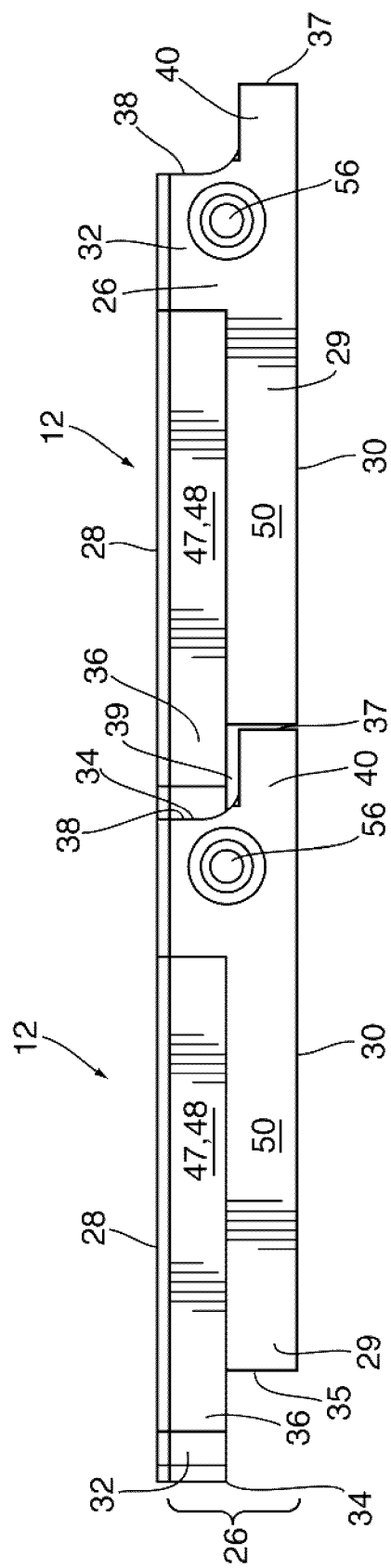
FIG. 10 is a front elevation view of the heat exchanger elements of FIG. 9.
Figure 11:
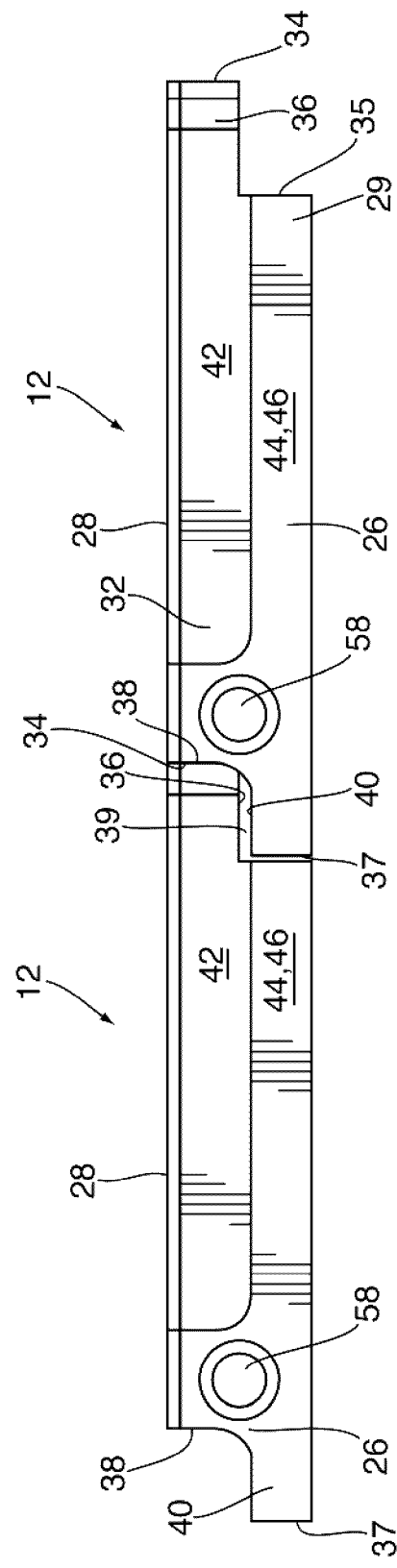
FIG. 11 is a rear elevation view of the heat exchanger elements of FIG. 9.
Figure 12:
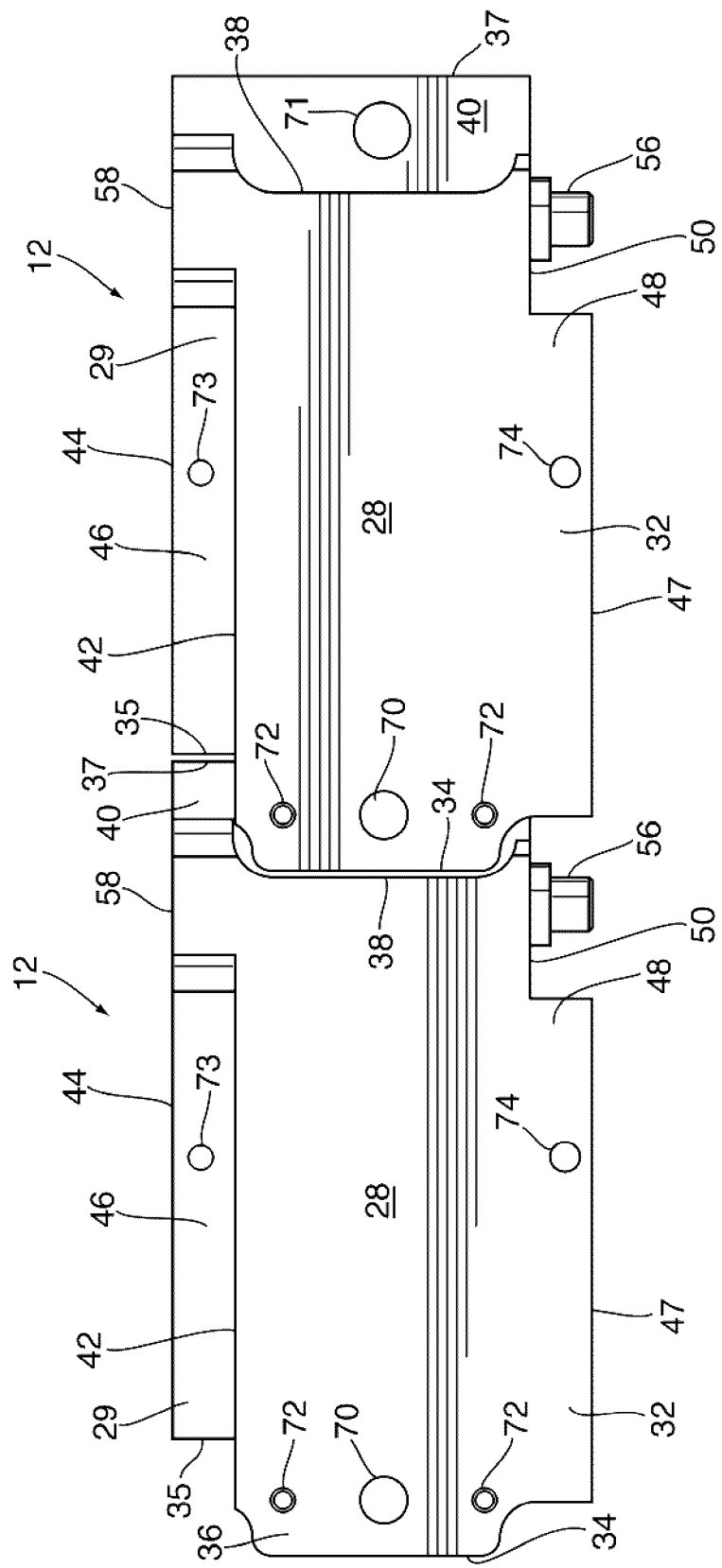
FIG. 12 is a top plan view of the heat exchanger elements of FIG. 9.
Figure 13:
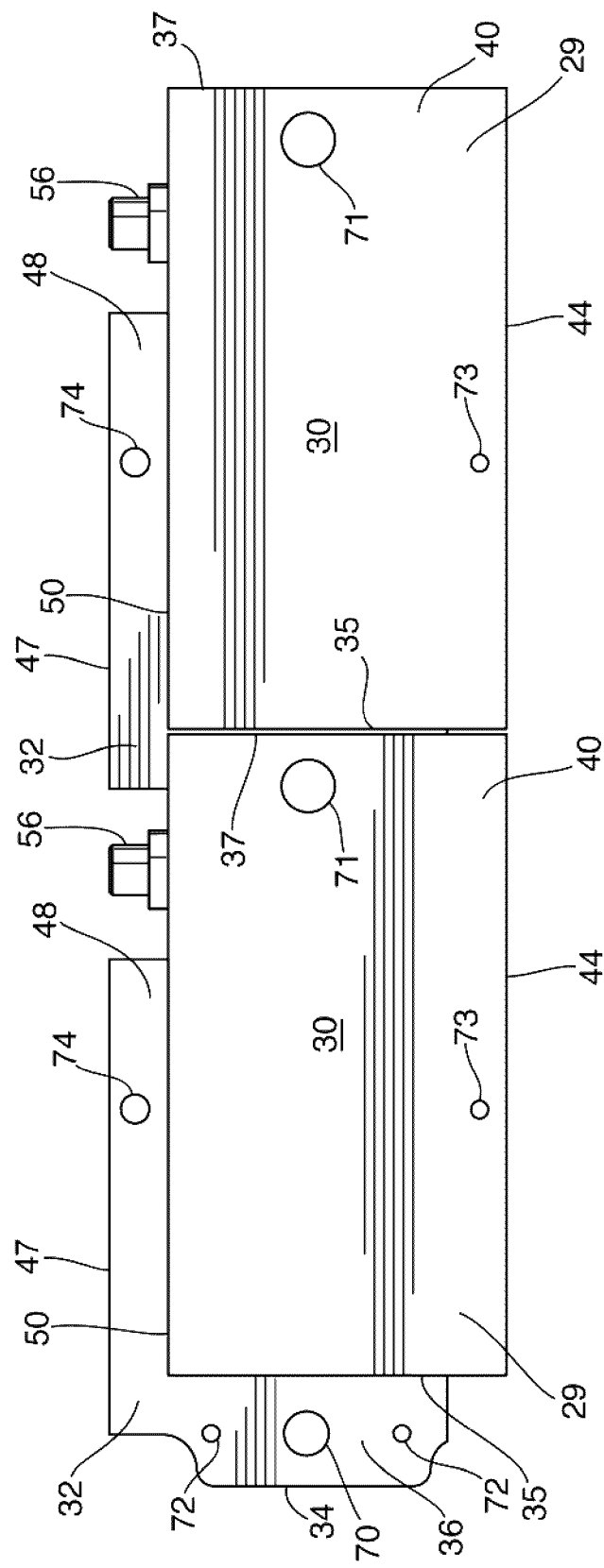
FIG. 13 is a bottom plan view of the heat exchanger elements of FIG. 9.

Referring now to FIGS. 7 and 8, the fluid cavity 54 is enclosed by the bottom and top portions 26, 28, and in the present embodiment is formed within the bottom portion 26. The fluid cavity 54 is surrounded by a peripheral flange 55 defined by a flat planar upper surface of the bottom portion 26, which seals against the inner surface of the top portion 28 when the two components are arranged in their mating relationship fluidly enclosing fluid cavity 54.

A fluid inlet 56 is formed in and extends through a first lateral side surface 57 of the heat exchanger element 12, which in the present embodiment is a wall of the lower portion 29 defining the second lateral edge 50 thereof, such that the fluid inlet 56 is in fluid communication with fluid cavity 54. The fluid inlet 56 in the form of a tubular or cylindrical projection or fitting that extends outwardly away from the first lateral side surface 57 and second lateral edge 50 of the lower portion 29. In some embodiments the tubular or cylindrical projection that forms the fluid inlet 56 may be a separate component that is inserted or otherwise fixed within a corresponding opening formed in the bottom portion 26 while in other embodiments it may be formed integrally as part of the heat exchanger element 12. Directly opposite to the fluid inlet 56 and longitudinally aligned therewith, a fluid outlet 58 is formed in and extends through a second lateral side surface 59 of the heat exchanger element 12, which in the present embodiment is a wall defining the opposed first lateral edge 44 thereof, such that the fluid outlet 58 is in fluid communication with fluid cavity 54.

Figure 22:
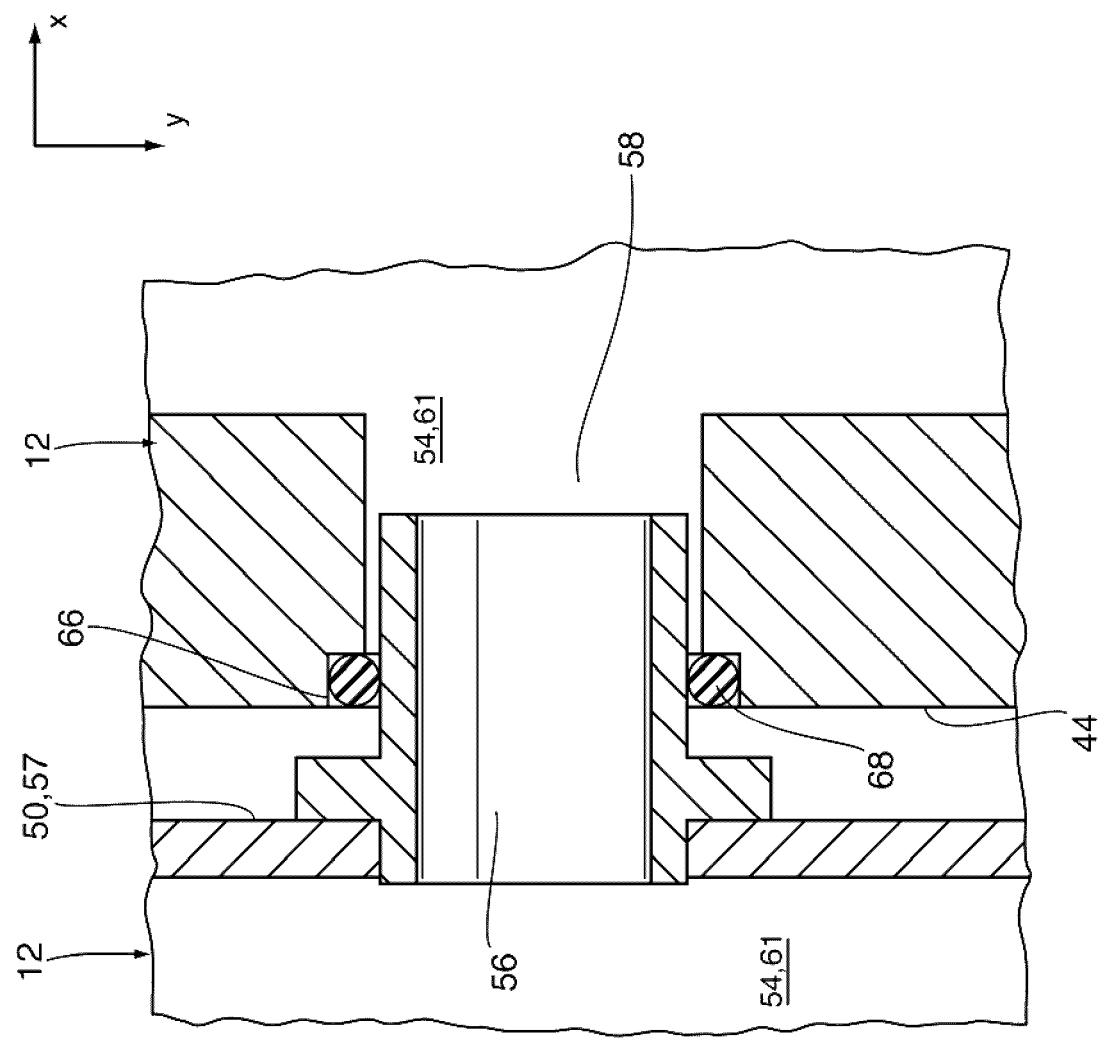
FIG. 22 is a cross-section in an x-y plane through a fluid inlet of a heat exchanger element received within the corresponding fluid outlet of an adjacent heat exchanger element.

As shown in the close-up of FIG. 22, fluid outlet opening 58 is sized to receive the fluid inlet 56 that projects from a laterally adjacent heat exchanger element 12, when the individual heat exchanger elements 12 are arranged in their interlocking arrangement, as further described below. Accordingly, when the heat exchanger elements 12 are arranged laterally adjacent to one another as in FIG. 1, the fluid inlet 56 of one heat exchanger element 12 is received within the corresponding fluid outlet 58 of an adjacent heat exchanger element 12. As shown, the outlet 58 may be provided with an annular groove 66 in which a sealing device 68 in the form of an O-ring is received, the O-ring forming a fluid-tight seal against the outer surface of outlet 56, wherein the seal permits some relative displacement laterally along the x-axis in response to thermal expansion of heat exchanger 10. In this way, all the heat exchanger elements 12 in each row A, B, C, D are fluidly interconnected with one another and with the inlet and outlet manifold elements 14, 16, such that a continuous flow path is formed from the inlet manifold element 14 to the outlet manifold element 16 along each row A, B, C, D of heat exchanger elements 12. Since the heat exchanger elements 12 within each laterally extending row are fluidly interconnected to each other by way of a "peg and socket" or telescopic connection between the fluid inlets 56 and the fluid outlet openings 58, a fluid-tight connection between the adjacent elements 12 is maintained even when there is slight lateral separation or relative movement between the individual heat exchanger elements 12.

In some embodiments, fluid cavity 54 is fitted with a turbulence-enhancing insert 60, such as a fin plate or turbulizer, typically in the form of a corrugated sheet that sits within the fluid cavity 54, in contact with the top and bottom walls thereof, and forms generally longitudinal fluid flow passages extending from one longitudinal end of the fluid cavity 54 to the other for the flow of the heat exchanger fluid through the heat exchanger element 12. In other embodiments, the fluid cavity 54 may be formed with a plurality of longitudinal fluid flow passages directly therein without requiring the use of a turbulence-enhancing insert 60.

In the subject example embodiment, the fluid cavity 54 has two spaced apart flow pass dividers 62 that extend inwardly into the fluid cavity 54 from the end edge of the cavity 54 that is proximal to the inlet and outlet 56, 58. A further flow pass divider 62 extends inwardly into the fluid cavity 54 from the opposed end edge of fluid cavity 54 and is arranged to be intermediate the flow pass dividers 62 formed on the opposite end of the fluid cavity 54. The flow pass dividers 62 generally extend into the interior of the fluid cavity 54 by the same distance, the distance between the flow pass dividers 62 from each end of the fluid cavity 54 generally corresponding to the length of the turbulence-enhancing insert 60 that is arranged within the cavity 54. Accordingly, the flow pass dividers 62 serve to create separate manifold areas 64 at either end of the fluid cavity 54 in the gaps formed between the corresponding end of the turbulence-enhancing insert 60 and the end edge of the fluid cavity 54. In use, fluid enters the heat exchanger element 12 through fluid inlet 56 and is delivered to the first manifold area 64(1) where it is distributed to a first set of longitudinal flow passages formed by the turbulence-enhancing insert 60 to the second manifold area 64(2) where the fluid is then switch-backed through the next set of flow passages formed by the turbulence-enhancing insert 60 to the third manifold area 64(3). Once in the third manifold area 64(3) the fluid is switch-backed once again through the next set of flow passages formed by the turbulence-enhancing insert 60 to the fourth manifold area 64(4) where it is switch-backed a final time through the final set of flow passages formed by the turbulence-enhancing insert 60 to the fifth manifold area 64(5) where it is discharged from the heat exchanger element 12 through fluid outlet opening 58 to the adjacent heat exchanger element 12 in the corresponding row of elements as will be described in further detail below. Thus, it can be seen that an internal flow path 61 (FIG. 8) extending between and interconnecting the fluid inlet 56 and fluid outlet 58 of each heat exchanger element 12 may be defined through the use of elements which route the fluid through the fluid cavity 54. In the present embodiment, these elements are the turbulence-enhancing insert 60 and the flow pass dividers 62 which together form five separate manifold areas 64(1)-64(5) that define the multi-pass, serpentine or switch-backed flow path 61 through the heat exchanger element 12. The serpentine flow path 61 followed by the fluid is illustrated by arrows in FIG. 8. It will be understood that the heat exchanger 10 is not restricted to the particular flow path 61 described and that different flow paths 61 through the individual heat exchanger elements 12 are contemplated and included within the scope of the present disclosure.

In order to form heat exchanger 10, the individual heat exchanger elements 12 are interconnected, with each heat exchanger element 12 being connected to at least one adjacent heat exchanger element 12 to allow for expansion and/or contraction of the plurality of heat exchanger elements 12 as well as rotational movement about said principal axis and/or said transverse axis.

The interconnection and interlocking of a longitudinally adjacent pair of heat exchanger elements 12 is shown in FIGS. 9 to 13 and is now described below. Although FIGS. 9 to 13 show the interconnection and interlocking of pairs of inner heat exchanger elements 12(2) or 12(3) of row A, B or C, the following description applies equally to the interconnection and interlocking of pairs of outer heat exchanger elements 12(1) or 12(4). As shown, the two heat exchanger elements 12 are arranged end-to-end such that the first interlocking longitudinal end portion 36 of one heat exchanger element 12 is arranged generally over top of (i.e. overlaps) the second interlocking longitudinal end portion 40 of the longitudinally adjacent heat exchanger element 12 so that the first end 34 of the upper portion 32 of one heat exchanger element 12 comes generally into abutment or surface-to-surface contact with the second end 38 of the upper portion 32 of the other heat exchanger element 12 so that the first and second interlocking longitudinal end portions 36,40 directly face or oppose one another. A small gap 39 may be left between the first and second interlocking longitudinal end portions 36, 40 as shown for instance in FIGS. 10 and 11 to allow for tolerances and/or discrepancies in the surface as well as to allow for friction-free sliding movement between the two heat exchanger elements 12. In order to facilitate the alignment and interlocking arrangement of longitudinally adjacent heat exchanger elements 12, a through-hole or opening 70 is formed in the first interlocking longitudinal end portion 36 of the upper portion 32 of each heat exchanger element 12. Similarly, a through-hole or opening 71 is formed in the opposed second interlocking longitudinal end portion 40 of the lower portion 29 of the heat exchanger elements 12. As shown most clearly in FIG. 5, one of the openings 70, 71 is formed so as to be larger than the other, in this instance through-hole 71 has a slightly larger diameter that through-hole 70.

Figure 23:
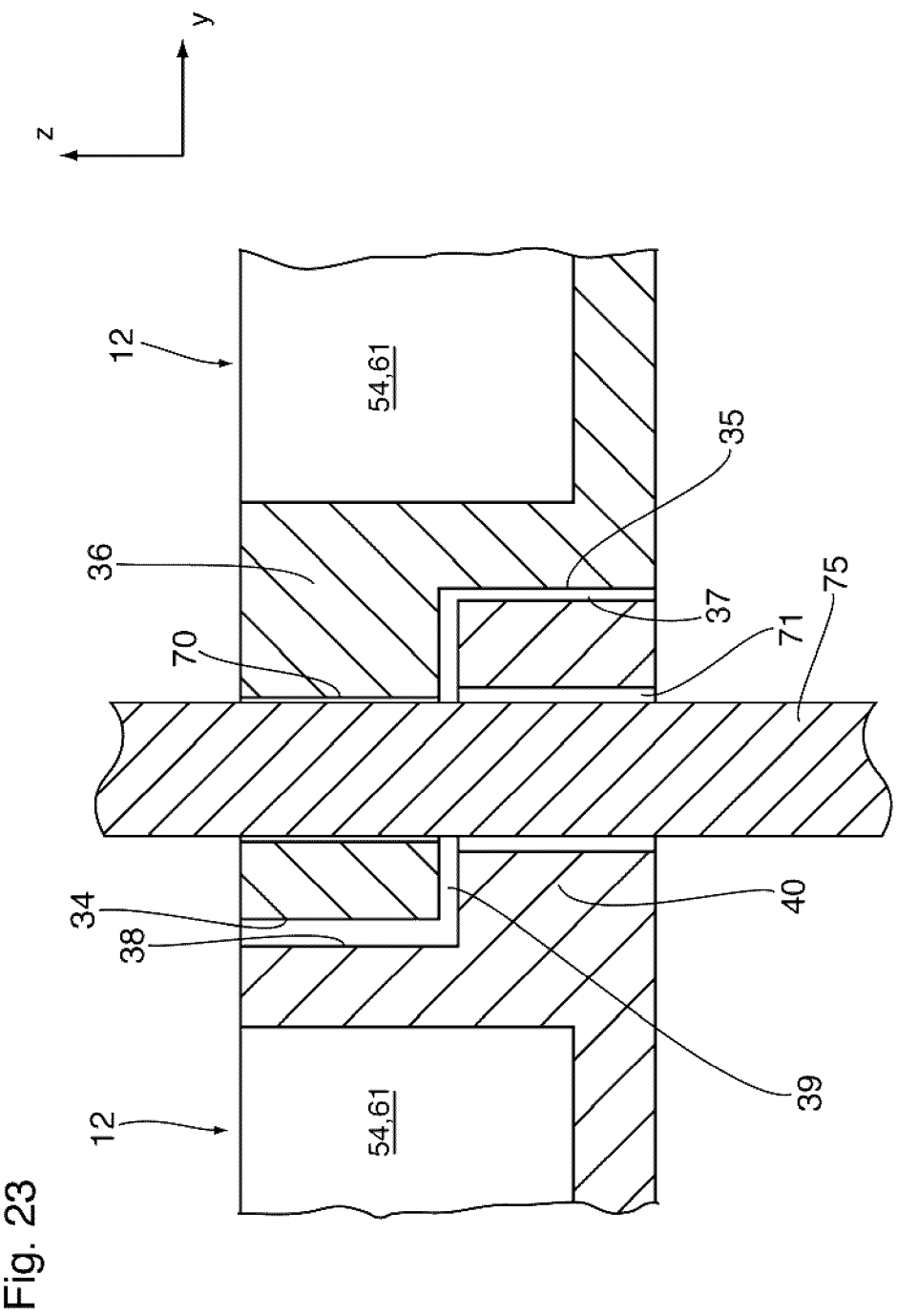
FIG. 23 is a cross-section in an y-z plane through the longitudinal end portions of a pair of interconnected heat exchanger elements.

The above-described arrangement of openings 70, 71 is shown in the close-up of FIG. 23. It can be seen that the loose engagement of rod 75 in opening 71 will permit some relative longitudinal movement between the two heat exchanger elements 12 in response to thermal expansion, and also some limited rotational movement about the x-axis.

The heat exchanger elements 12 in row D have a slightly modified configuration in that they have only a first interlocking longitudinal end portion 36. The opposite end has no interlocking end portion, but rather is formed without any offset and is simply provided with an opening 70 to receive a tie rod 75. The configuration of this end can be seen in FIGS. 15A and 15B.

A pair of smaller through-holes or openings 72 is formed on either side of the main opening 70, which openings 72 also extend through the first interlocking longitudinal end portion 36. When the longitudinally adjacent heat exchanger elements 12 are arranged as in FIG. 9, through-hole 70 of one heat exchanger element 12 overlaps and axially aligns with through-hole 71 of the longitudinally adjacent heat exchanger element 12.

Figure 14:
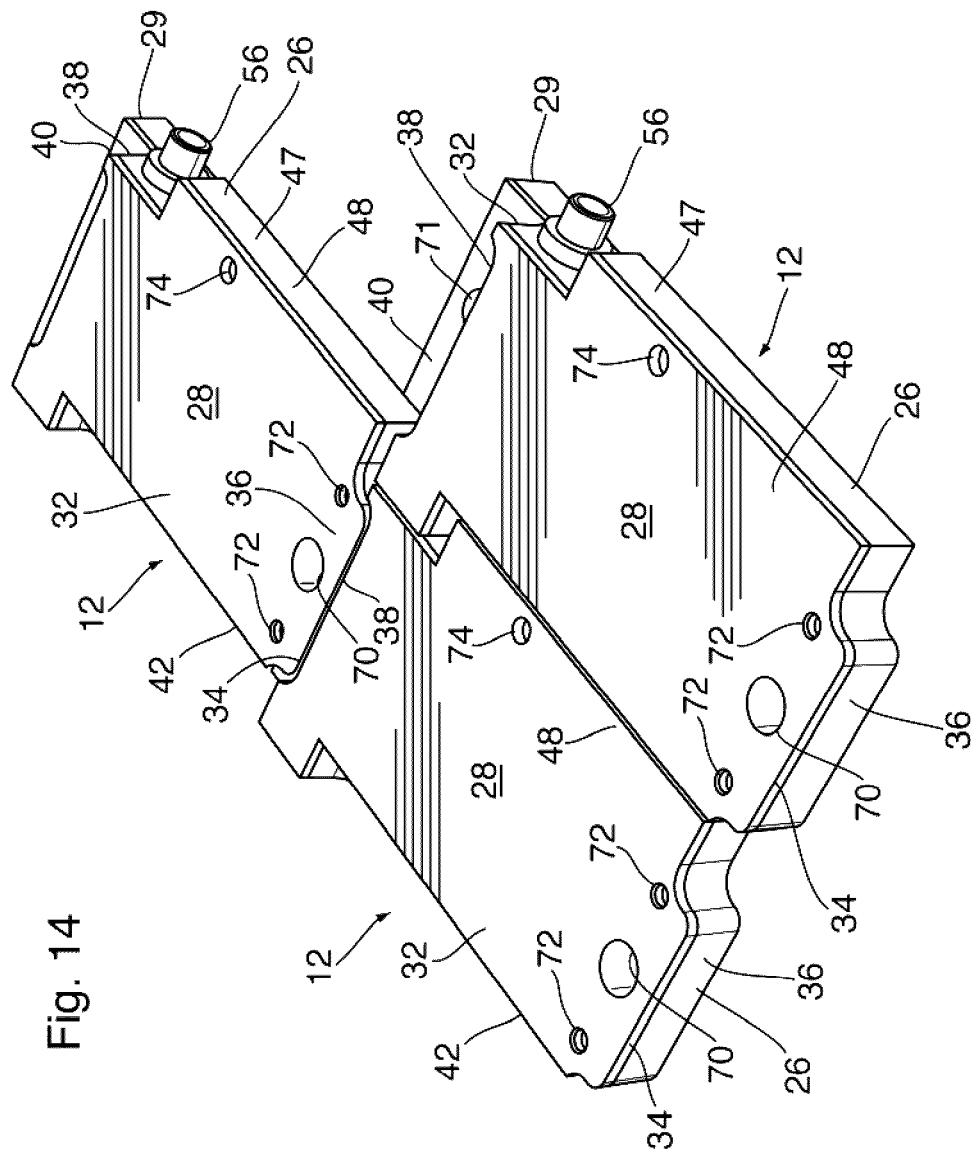
FIG. 14 is a top, perspective view of three individual heat exchanger elements of FIG. 2 arranged in their mating, interlocking arrangement.

The interconnection and interlocking of a laterally adjacent pair of heat exchanger elements 12 is shown in FIG. 14 and is now described below. When a heat exchanger element 12 is arranged in an interconnected and interlocked with a laterally adjacent heat exchanger element 12, the first interlocking lateral edge portion 46 of one heat exchanger element 12 is arranged over top of (i.e. overlaps) the second interlocking lateral edge portion 48 of a laterally adjacent heat exchanger element 12 so that the first lateral edge 42 of the upper portion 32 of one heat exchanger element 12 comes generally into abutment or surface-to-surface contact with the second lateral edge 47 of the upper portion 32 of the laterally adjacent heat exchanger element 12 so that the first and second interlocking lateral edge portions 46,48 directly face or oppose one another. A small gap may be left between the first and second interlocking lateral edge portions 46, 48 to allow for tolerances and/or discrepancies in the surface as well as to allow for friction-free sliding movement between the two heat exchanger elements 12, essentially the same as gap 39 between the longitudinal end portions 36, 40 as described above and shown in the drawings.

In order to facilitate the alignment and interlocking arrangement of laterally adjacent heat exchanger elements 12, additional through-holes or openings 73, 74 are formed in the respective first and second interlocking lateral edge portions 46, 48.

In addition, as already described above, the interconnection of laterally adjacent heat exchanger elements 12 results in the fluid cavities 54 and the internal flow paths 61 of the two heat exchanger elements 12 being fluidly coupled together.

In the embodiment described herein, openings 70, 72 and 74 extend through both the bottom and top portions 26, 28 of each heat exchanger element 12, while openings 71 and 73 extend only through the bottom portion 26.

In some embodiments, locating rods or tie rods 75 (see for instance FIGS. 16-20) can be used for ensuring the interlocking and proper alignment of the heat exchanger elements 12 in relation to each other as well as in relation to additional components of an overall system. Set screws (FIG. 15B) can also be used in any of through-holes 72, 73, 74 in order to assist with the interlocking arrangement and relative relationship between the various heat exchanger elements 12. Where set screws 52 are used, the through-holes 72, 73, 74 which receive the set screws 52 will be threaded. For example with the set screws 52 threadingly engaged in any of openings 72, 73, 74 and extending through the base of the respective openings 72, 73, 74 so as to engage the corresponding surface on the adjacent heat exchanger elements 12. The set screws 52 can be individually adjusted between the various heat exchanger elements 12 to allow for varying degrees of relative movement therebetween.

In some embodiments, the diameter of at least one of the through-holes 70, 71 is slightly larger than the diameter of the locating rods or pins 75 that are inserted through the aligned openings 70, 71 to allow for some relative movement between the individual heat exchanger elements 12. More specifically, the difference between the size of through-holes 70, 71 and the size of the corresponding locating rods 75 allows for slight movement in both the x and y directions between the various heat exchanger elements 12 as well as tilting or rotation about at least the x-axis, while the set screws can also be adjusted so as to allow for certain amounts of tilting and/or rotation between the various heat exchanger elements 12 about the y-axis. The potential rotation about the x and y axes is illustrated schematically FIG. 15A by directional arrows 77, 79.

Once the heat exchanger core has been assembled from the required amount of individual heat exchanger elements 12, inlet and outlet manifold elements 14, 16 are arranged on the respective lateral sides of the heat exchanger core. As described above, in the subject example embodiment, the outer heat exchanger elements 12(1) and 12(4) that are interconnected with the respective inlet and outlet manifold elements 14, 16 have a different configuration along the edges which interconnect with the inlet and outlet manifold elements 14, 16, and the two outer heat exchanger elements 12(1), 12(4) are different from each other.

Figure 15A:
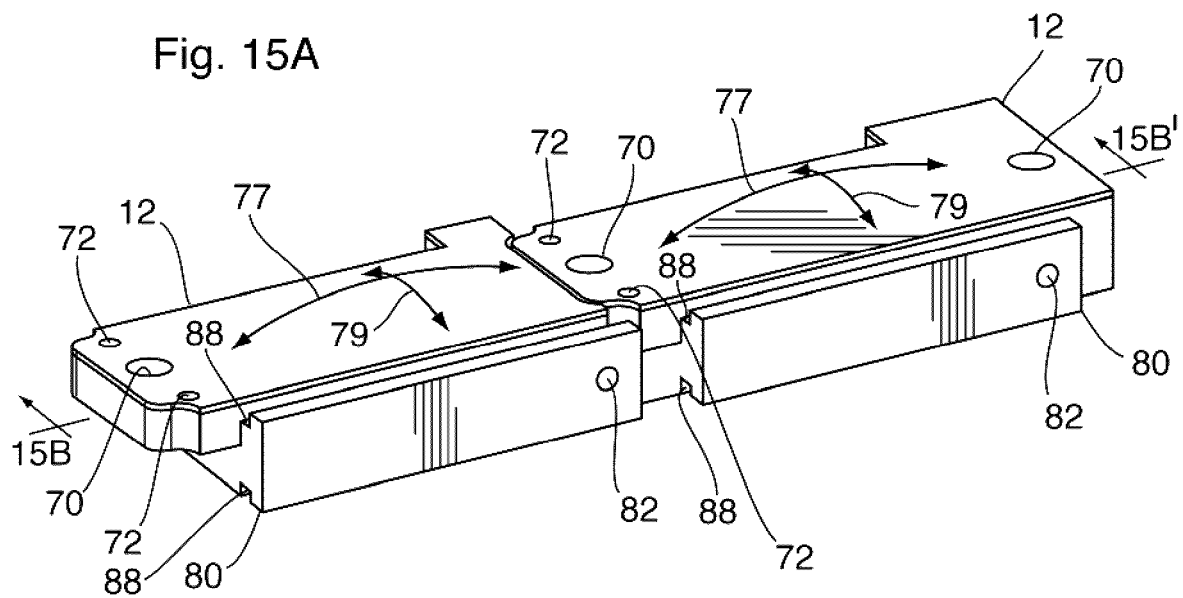
FIG. 15A is a perspective view of two mating heat exchanger elements illustrating the relative motion permitted therebetween.
Figure 15B:
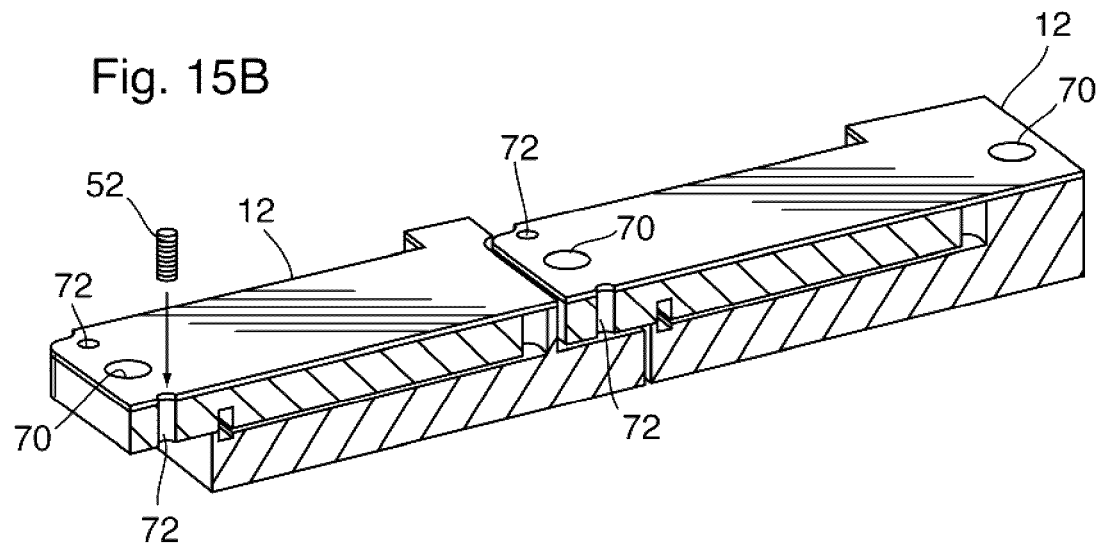
FIG. 15B is a cross-sectional view of the heat exchanger elements of FIG. 15A taken along section line 15B-15B' shown in FIG. 15A.
Figure 16:
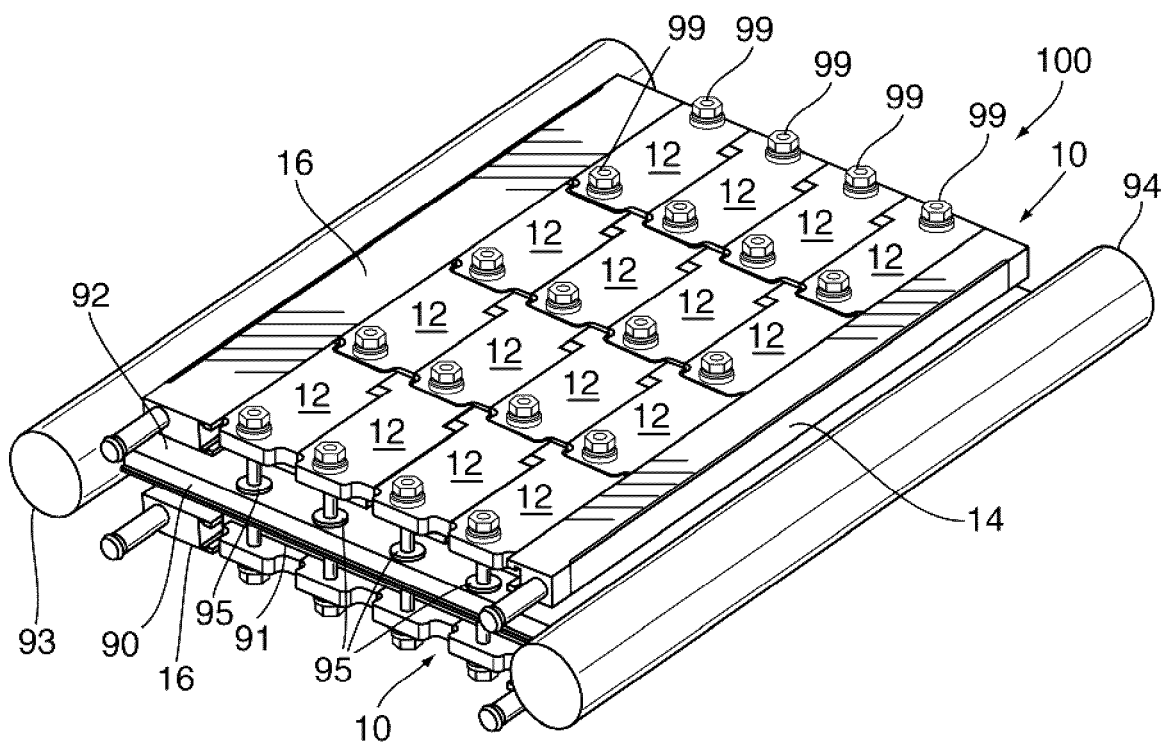
FIG. 16 is a perspective view of a thermoelectric generator incorporating the heat exchanger of FIG. 1.

For example, FIG. 15A shows a pair of interconnected, longitudinally adjacent first heat exchanger elements 12(1). As shown therein, the offsetting second lateral edges 47, 50 of the upper and lower portions 32, 29 are replaced by a tongue portion 80 with an fluid opening 82 formed along an exposed lateral edge of the heat exchanger element 12, wherein the tongue portion is adapted to be received in the groove 84 formed along the inner surface 22 of the inlet manifold element 14 and form a tongue and groove connection therewith. As can be seen from FIGS. 1A and 15A, the respective groove 84 of inlet manifold element 14 and the tongue portion 80 of each first heat exchanger element 12(1) may respectively be provided with interlocking grooves 86, 88 to provide an interlock between the first heat exchanger elements 12(1) and the inlet manifold element 14.

Although not shown in the drawings, a similar tongue portion 80 is provided in the last heat exchanger elements 12(4). However, the tongue portion 80 of last heat exchanger elements 12(4) will be provided along the opposite lateral edge, such that the tongue replaces the first lateral edges 42, 44 of the respective upper and lower portions 32, 29. As shown, fluid openings 82 are formed in the tongue portion 80 for engaging with the corresponding fluid openings 20 formed in the inner surfaces 22 of the inlet and outlet manifold elements 14, 16.

By forming the heat exchanger 10 of individual heat exchanger elements 12 that are interconnected in such a manner so as to allow for both planar and rotational movement between the individual heat exchanger elements 12 in their interlocking arrangement, the heat exchanger 10 is able to conform to surface variations as well as to adapt to thermal expansion and/or contraction due to the range of temperatures to which the heat exchanger 10 is exposed that would otherwise result in internal stresses within the body of the heat exchanger 10 that can ultimately result in cracking and/or failure of the heat exchanger 10 over time.

Figure 17:
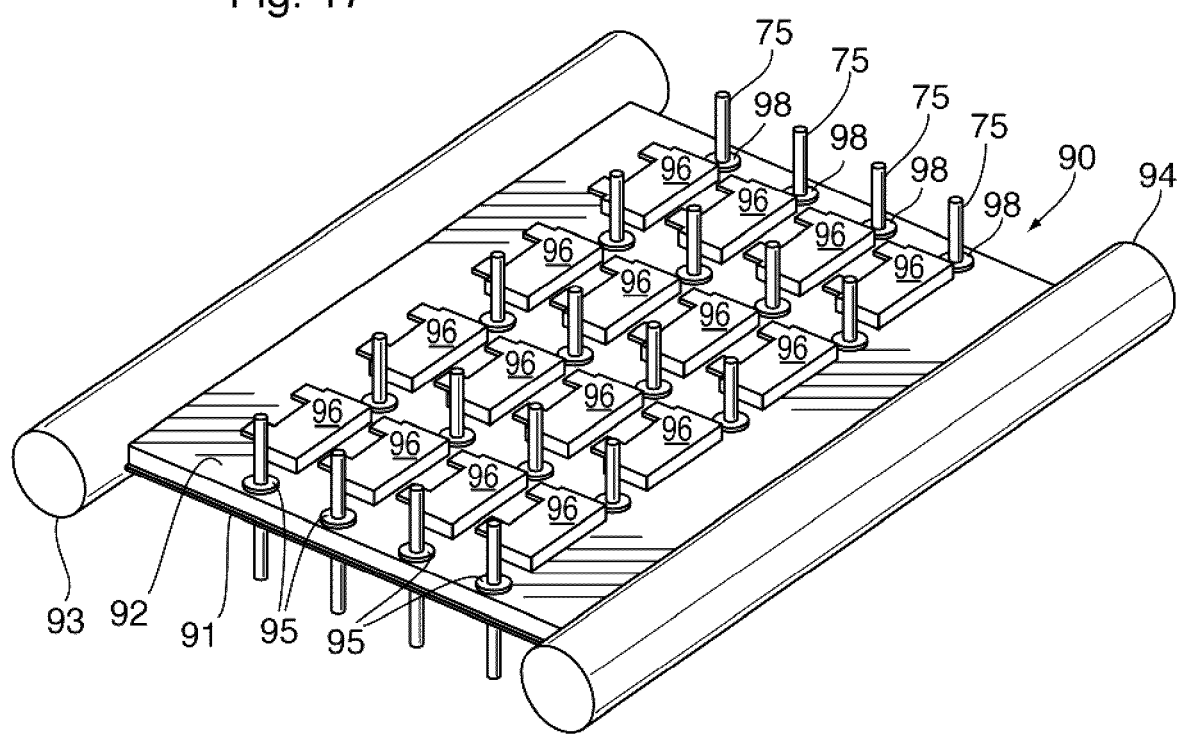
FIG. 17 is a perspective view of the thermoelectric generator of FIG. 16 with the outer heat exchangers removed.

One particular application for the heat exchanger 10 described above in which the ability of the heat exchanger 10 to conform to surface variations as well as to respond to thermal expansion and/or contraction of the heat exchanger 10 is wherein the heat exchanger 10 serves as a cold heat exchanger for a thermoelectric generator (TEG) 100 as illustrated for instance in FIGS. 16-19. In the subject illustrated embodiment, the thermoelectric generator 100 is made up of a hot temperature heat exchanger 90 that is in the form of any known suitable heat exchanger enclosing various fluid flow passages between spaced apart walls or plates 91, 92 for the flow of a hot temperature fluid therethrough, for instance exhaust gases produced in an automobile system, accordingly, it will be understood that the hot heat exchanger 90 will typically operate at over 700° C. The hot heat exchanger 90 is equipped with its own respective inlet and outlet manifolds 93, 94 are for inletting and discharging the hot fluid to and from the heat exchanger 90. Individual thermoelectric (TE) modules 96 are arranged at spaced apart intervals on both the outer surfaces of the outer walls 91, 92 of the hot heat exchanger 90. As shown in FIG. 17, sixteen individual thermoelectric modules 96 are arranged on either side of the hot heat exchanger 90 which corresponds to the number of individual heat exchanger elements 12 used to form the example embodiment of heat exchanger 10 illustrated in FIG. 1, however, it will be understood that the actual number of thermoelectric modules 96 and the actual amount of individual heat exchanger elements 12 can be varied depending on the particular application and that the present disclosure is not intended to be limited to a thermoelectric generator 100 having 16 thermoelectric modules 96 arranged on either side of the hot heat exchanger 90 with corresponding cold heat exchangers 10 each being made up of sixteen individual heat exchanger elements 12. It has, however, been found that subdividing or segmenting the cold heat exchanger, e.g. heat exchanger 10, into individual heat exchanger elements 12 that generally correspond to the size of the thermoelectric modules 96 is one way that allows for the use of a thinner thermal interface material (TIM) which tends to result in an improved thermal interface between the heat exchangers 10 and the thermoelectric modules 96. Given that the cold heat exchanger 10 operates at much lower temperatures as compared to the hot heat exchanger 90 within the thermoelectric generator 100, e.g. under 110° C., the cold heat exchanger 10 is more conducive to having a subdivided or segmented structure.

As shown in FIG. 17, the hot heat exchanger 90 is provided with a plurality of through-holes or openings 98 across the body thereof, the locations of which generally correspond to the locations of through-holes 70, 71 formed in the individual heat exchanger elements 12. Unlike the through-holes 70, 71 formed in the heat exchanger elements 12, through-holes 98 are sized so as to be a tight, interlocking fit with the locating rods 75. In some embodiments, the rods 75 can be tightly affixed to the hot heat exchanger by an intermediate ceramic insulator 95 of low thermal conductivity to reduce parasitic heat loss bypassing the thermoelectric material at the interface with the hot heat exchanger 90. Accordingly, once the thermoelectric modules 96 are arranged across the surface of the hot heat exchanger 90 and the locating rods 75 are inserted through the openings 98, the individual heat exchanger elements 12 that form heat exchanger 10 can be arranged over top thereof on either side of the hot heat exchanger 90 so as to effectively sandwich the thermoelectric modules 96 between the corresponding surface 91 or 92 of the hot heat exchanger 90 and the corresponding cold heat exchanger 10. Securing devices 99 such as washers and nuts are arranged on the corresponding threaded ends of the locating rods 75 so as to secure the entire assembly together.

In use, the hot heat exchanger 90 is exposed, for instance, to the exhaust of an internal combustion engine which can then subject the heat exchanger to thermal elongation in the temperature range from about −40 to 700° C. where as the cold heat exchangers 10 experience a lesser extreme in temperature change from about −40 to 110° C. This can further be exaggerated based on differences in the materials used to construct the individual heat exchangers, for instance stainless steel hot heat exchangers as compared to aluminum cold heat exchangers 10. When exposed to such differences in temperature ranges, deflection (and/or expansion) of the cold heat exchanger 10 is expected which deflection can be catastrophic leading to failure of the thermoelectric material due to shear stresses at the interface between the thermoelectric modules 96 and the corresponding cold heat exchanger 10. By employing a cold heat exchanger 10 having a subdivided or segmented structure as described above in connection with heat exchanger 10 which allows for relative movement between the individual heat exchanger elements 12 that make up the overall heat exchanger structure, it has been found that heat exchanger 10 is able to withstand the shear stresses to which it is exposed when used as part of the thermoelectric generator 100. More specifically, in order to accommodate for the shear stresses, the individual heat exchanger elements 12 of the cold heat exchangers 10 are fixed or secured to the hot heat exchanger 90 at one end thereof by way of the rod 75 that is tightly fit through the smaller of the through-holes 70, 71 formed in the heat exchanger elements while movement about the other of the rods 75 that is inserted through the other, larger one of the through-holes 70, 71 at the opposed end of the heat exchanger element 12 is permitted. As a result, by having one end of each heat exchanger element 12 that is fixed to the hot heat exchanger 90 and having a second end that is moveable about its connection to the hot heat exchanger 90, each heat exchanger element 12 is carried along with their paired thermoelectric module 96 which is fixed to the expanding and contracting hot heat exchanger 90. Accordingly, the thermoelectric modules 96 need to be locked to at their specific location on the hot heat exchanger 90 and locked to its mating cold heat exchanger 10 despite the differential in thermal elongation of the cold and hot heat exchangers 10, 90. In the subject example embodiment, this is achieved since at least one of the through-holes 70, 71 formed in each of the heat exchanger elements 12 has a larger diameter than the locating rods 75. Accordingly, sufficient clearance between the two is provided which allows for the thermal expansion/contraction of the hot heat exchanger 90, the individual cold heat exchanger elements 12 moving along with one of the locating rods 75. By having a locating rod 75 at each end of the individual heat exchanger elements 12 permits the cold heat exchanger element 12 to sandwich the corresponding thermoelectric module 96 between itself and the hot heat exchanger 90 in a manner that allows the cold heat exchanger 10 to follow with the expansion and contraction of the hot heat exchanger 90. The securing devices used at either end of the locating rods 75 permit the individual heat exchanger elements 12 to be forced against the corresponding thermoelectric module 96 and also allow for adjustment so that the individual heat exchanger elements 12 can tilt along its principal or longitudinal axis (i.e. y-axis) between the two locating rods 75 arranged at either end thereof. The use of set screws 52 described above in through-holes 72, 73, 74 allow for tilting of the heat exchanger elements 12 in relation to one another along the principal or longitudinal axis (i.e. y-axis) and/or along the transverse axis (i.e. x-axis) as illustrated in FIG. 15A. The tilting of the individual heat exchanger elements 12 allows for the heat exchanger 10 to conform to surface imperfections and/or additional deflections that may also occur as a result of the thermal stresses to which the heat exchanger 10 is exposed, the tilting of the individual heat exchanger elements 12 generally being limited to ensure that sufficient parallelism or overall flatness is maintained for appropriate thermal contact with the corresponding thermoelectric modules 96.

Following an adjustment sequence of the nuts 99 on each locating rod 75 and the set screws 52 on each of the cold heat exchanger elements 12, each of the cold heat exchangers 10 can conform or be adapted to accommodate each thermoelectric module 96 in terms of height and parallelism tolerances, as well as to local surface tilting and flatness of the adjacent heat exchanger elements 12. A specific tightening sequence of set screws 52 and nuts can be developed to achieve the required attributes in a simple sequential manner. For instance, adjustment at one end of a central row of locating rods 75 and adjusting first the set screws 52 then the nuts 99 of each of the heat exchanger elements 12 along the central row followed by its neighbouring row progressing from the central row outwardly in a row by row manner toward the manifold elements 14, 16. It will be understood however, that the specific tightening and/or adjustment sequence will depend on the particular application of the overall device, the required attributes, the number of individual heat exchanger elements 12, etc. and that the present disclosure is not intended to be limited to the example tightening sequence described herein.

While heat exchangers 10 have the ability to conform and/or expand/contract along with the hot heat exchanger 90 when incorporated into a thermoelectric generator 100, the integrity of the flow path through the overall heat exchanger 10 is maintained due to the telescoping or sliding engagement between the tubular or cylindrical fluid inlets 56 and the corresponding fluid outlets 58 on the adjacent elements 12. Therefore, even as individual heat exchanger elements 12 move relative to one another, the fluid connection between the individual heat exchanger elements 12 is maintained ensuring proper and leak-free functioning of the overall heat exchanger 10.

While heat exchanger 10 has been described above within the context of a thermoelectric generator 100, it will be understood that a heat exchanger 10 having the ability to accommodate for thermal expansion/contraction as well as to conform and/or adapt to surface imperfections and or tolerances associated with height and/or parallelism can have applications that extend beyond thermoelectric generators alone. Accordingly, heat exchanger 10 may be used for various other applications wherein the heat exchanger may be exposed to a wide range of temperatures resulting in overall deflection of the device. Therefore, it will be understood that certain adaptations and modifications of the described embodiments can be made and that the above discussed embodiments are considered to be illustrative and not restrictive.

What is claimed is:

1. A heat exchanger, comprising:
   a plurality of heat exchanger elements, each said heat exchanger element having a principal axis and a transverse axis, and a fluid inlet, a fluid outlet and an internal flow path extending between and interconnecting said fluid inlet and fluid outlet;
   an inlet manifold element fluidly coupled to the fluid inlet of at least one of said plurality of heat exchanger elements;
   an outlet manifold element fluidly coupled to the fluid outlet of at least one of said plurality of heat exchanger elements;
   wherein said plurality of heat exchanger elements are interconnected, with each said heat exchanger element being connected to at least one adjacent said heat exchanger element to allow for expansion and/or contraction as well as rotational movement about said principal axis and/or said transverse axis.

2. The heat exchanger as claimed in claim 1, wherein the plurality of heat exchanger elements includes a first heat exchanger element and a second heat exchanger element which are arranged transversely adjacent to one another, and wherein the internal flow paths of the first and second heat exchanger elements are fluidly coupled together.

3. The heat exchanger as claimed in claim 1, wherein the plurality of heat exchanger elements includes a first heat exchanger element and a second heat exchanger element which are arranged transversely adjacent to one another, and wherein the first and second heat exchanger elements include lateral edge portions which interlock with one another so as to connect the first and second heat exchanger elements together.

4. The heat exchanger as claimed in claim 1, wherein the plurality of heat exchanger elements includes a first heat exchanger element and a third heat exchanger element which are arranged longitudinally adjacent to one another, and wherein the first and third heat exchanger elements include longitudinal edge portions which interlock with one another so as to connect the first and third heat exchanger elements together.

5. The heat exchanger as claimed in claim 3, wherein one of said fluid inlet and fluid outlet of each of said first heat exchanger element and said second heat exchanger element is in the form a protrusion extending away from the lateral edge portion of said first or second heat exchanger element, the other of said fluid inlet and fluid outlet being in the form of an opening adapted to slidingly receive the protrusion from the transversely adjacent first or second heat exchanger element so as to fluidly couple the internal flow path of the first heat exchanger element to the internal flow path of the second heat exchanger element.

6. The heat exchanger as claimed in claim 1, wherein a sliding face seal is provided between the inlet manifold element and each said heat exchanger element having its fluid inlet coupled to the inlet manifold element, and a sliding face seal is provided between the outlet manifold element and each said heat exchanger element having its fluid outlet coupled to the inlet manifold element;
    said heat exchanger further comprising a sealing device arranged at each of the sliding face seals, said sealing devices providing a sliding interface over which said heat exchanger elements can slide when engaged with said inlet and outlet manifold elements.

7. The heat exchanger as claimed in claim 6, wherein each said sliding face seal is formed between a fluid opening in one of the manifold elements and a fluid inlet or fluid outlet of one of said heat exchanger elements, and wherein the fluid inlet or outlet is provided along an exposed lateral edge of the heat exchanger element; and
    wherein the sealing element of each said sliding face seal comprises an O-ring which is received in an annular groove surrounding one of the fluid openings of one of the manifold elements or the fluid inlet or outlet of one of said heat exchanger elements.

8. The heat exchanger as claimed in claim 7, wherein each said annular groove surrounds one of the fluid openings of one of the manifold elements, and wherein the fluid openings of the manifold elements have a larger diameter than the fluid inlets and outlets of the heat exchanger elements.

9. The heat exchanger as claimed in claim 7, wherein each said manifold element has an inner surface along one or more of said fluid openings are provided;
    wherein a receiving groove is provided along the inner surface;
    wherein the exposed lateral edge of the heat exchanger element is formed on a mating outer edge portion of the heat exchanger element; and
    wherein said mating outer edge portion is adapted to be slidingly received in a tongue-and-groove arrangement in said receiving groove.

10. The heat exchanger as claimed in 1, wherein at least one of said heat exchanger elements comprises:
    a bottom portion and a top portion enclosing a fluid cavity, said bottom portion having a generally planar bottom surface;
    said heat exchanger element having a first interlocking longitudinal end portion, a second interlocking longitudinal end portion generally opposed to said first interlocking longitudinal end portion, a first lateral interlocking edge portion and a second lateral interlocking edge portion generally opposed to said first lateral interlocking edge portion;
    wherein said fluid inlet extends through a first lateral side surface of the heat exchanger element to be in fluid communication with said fluid cavity, said fluid outlet extends through an opposed second lateral side surface of the heat exchanger element at a location generally opposed to and aligned longitudinally with said fluid inlet so as to be in fluid communication with said fluid cavity, said internal flow path being formed within said fluid cavity.

11. The heat exchanger as claimed in claim 10, wherein said first longitudinal interlocking end portion of one said heat exchanger element is connected to the second longitudinal interlocking end portion of a longitudinally adjacent said heat exchanger element, and wherein the first lateral interlocking edge portion of one said heat exchanger element is connected to the second lateral interlocking edge portion of a transversely adjacent said heat exchanger element, the interlocking lateral edge portions of said adjacent heat exchanger elements establishing fluid communication between the internal flow paths of the heat exchanger elements.

12. The heat exchanger as claimed in claim 11, wherein said first and second interlocking longitudinal end portions of the longitudinally adjacent heat exchanger elements each comprise a through-hole extending therethrough, the through-hole in one of the first and second interlocking longitudinal end portions being larger than the through-hole formed in the other of the first and second interlocking longitudinal end portions, said through-holes formed in said first and second interlocking longitudinal end portions overlapping when said longitudinally adjacent heat exchanger elements are arranged in interlocking relationship; and
    wherein a locating rod is inserted through said overlapping through-holes.

13. The heat exchanger as claimed in claim 12, wherein said locating rod is securely fixed in one of said overlapping through-holes for securing the corresponding heat exchanger element to said locating rod; and
    wherein said locating rod has a diameter which is smaller than the other of said overlapping through-holes, the corresponding heat exchanger element being movable with respect to the longitudinally adjacent heat exchanger element about said locating rod.

14. The heat exchanger as claimed in claim 13, wherein the interlocking longitudinal end portions of the longitudinally adjacent heat exchanger elements and said interlocking lateral edge portions of the laterally adjacent heat exchanger elements each comprise mating generally parallel sliding surfaces.

15. The heat exchanger as claimed in claim 10, further comprising a fin plate insert arranged within said fluid cavity for defining said internal flow path between said fluid inlet and said fluid outlet.

16. The heat exchanger as claimed in claim 10, further comprising a pair of threaded holes formed on either side of the through-hole formed in said first longitudinal end for receiving set screws for limiting relative tilting movement between one heat exchanger element and a longitudinally adjacent heat exchanger element about the principal axis.

17. A thermoelectric generator assembly comprising:
a hot heat exchanger having a pair of spaced apart walls defining a fluid flow path therebetween for the flow of a first heat exchange fluid therethrough;
a plurality of thermoelectric modules arranged on the outer surface of each of said spaced apart walls;
a pair of cold heat exchangers arranged on either side of said hot heat exchanger in contact with said plurality of thermoelectric modules for the flow of a second heat exchange fluid therethrough, wherein each of said cold heat exchangers comprises:
a plurality of heat exchanger elements, each said heat exchanger element having a principal axis and a transverse axis, and a fluid inlet, a fluid outlet and an internal flow path extending between and interconnecting said fluid inlet and fluid outlet;
an inlet manifold fluidly coupled to the fluid inlet of at least one of said plurality of heat exchanger elements;
an outlet manifold fluidly coupled to the fluid outlet of at least one of said plurality of heat exchanger elements;
wherein said plurality of heat exchanger elements are interconnected, with each said heat exchanger element being connected to at least one adjacent said heat exchanger element to allow for expansion and/or contraction of said plurality of heat exchanger elements along said principal axis as well as rotational movement about said principal axis and/or said transverse axis;
a plurality of rods extending through said cold heat exchangers and through said hot heat exchanger for securing said cold heat exchangers to said hot heat exchanger and for establishing thermal contact between said cold heat exchangers and said thermoelectric modules.

18. The thermoelectric generator as claimed in claim 17, wherein each said heat exchanger element has a first end portion and a second end portion generally opposed to said first end portion;
wherein each said rod is securely fixed to said hot heat exchanger and extends through one of the end portions of one of said heat exchanger elements forming one of said cold heat exchangers;
wherein the first end portion of each said heat exchanger element is securely fixed to a first one of rods extending through said first end, and the second end portion of each said heat exchanger element is movable about a second one of said rods extending through said second end.

19. The thermoelectric generator assembly as claimed in claim 17, wherein said hot heat exchanger generally operates at a temperature of about 700° C. and said cold heat exchangers generally operate at a temperature of about 110° C.

20. The thermoelectric generator assembly as claimed in claim 17, wherein the number of heat exchanger elements in each cold heat exchanger corresponds to the number of thermoelectric modules arranged on the corresponding side of the hot heat exchanger.

\* \* \* \* \*